(12) United States Patent
Granig et al.

(10) Patent No.: US 7,956,610 B2
(45) Date of Patent: Jun. 7, 2011

(54) SENSOR FOR SENSING A MAGNETIC FIELD DIRECTION, MAGNETIC FIELD DIRECTION SENSING, METHOD FOR PRODUCING MAGNETIC FIELD SENSORS, AND WRITE-IN APPARATUS FOR PRODUCING MAGNETIC FIELD SENSORS

(75) Inventors: Wolfgang Granig, Sachsenburg (AT); Francesco Alex Maone, Zurich (CH)

(73) Assignee: Infineon Technologies AG, Neubiberg (DE)

( * ) Notice: Subject to any disclaimer, the term of this patent is extended or adjusted under 35 U.S.C. 154(b) by 608 days.

(21) Appl. No.: 12/116,830

(22) Filed: May 7, 2008

(65) Prior Publication Data

US 2008/0278158 A1 Nov. 13, 2008

(30) Foreign Application Priority Data

May 7, 2007 (DE) .......................... 10 2007 021 320

(51) Int. Cl.
*G01R 33/02* (2006.01)

(52) U.S. Cl. ..................... 324/252; 324/207.21; 324/249
(58) Field of Classification Search .................. 324/252, 324/207.21, 249
See application file for complete search history.

(56) References Cited

U.S. PATENT DOCUMENTS

| 5,689,185 A | 11/1997 | Widdershoven et al. |
| 7,064,537 B2 * | 6/2006 | Sudo et al. ............... 324/207.21 |
| 2002/0006017 A1 | 1/2002 | Adelerhof |

FOREIGN PATENT DOCUMENTS

| DE | 197 12 833 A1 | 10/1998 |
| DE | 198 39 450 A1 | 3/2000 |
| DE | 695 32 396 T2 | 12/2004 |

* cited by examiner

*Primary Examiner* — Reena Aurora
(74) *Attorney, Agent, or Firm* — Slater & Matsil, L.L.P.

(57) ABSTRACT

A sensor for sensing a magnetic field direction has a plurality of magnetoresistive sensor elements, each of which having a main sensitivity direction with respect to a present magnetic field. Lines associated with the main sensitivity directions of the magnetoresistive sensor elements and passing through the magnetoresistive sensor elements intersect in an area outside the magnetoresistive sensor elements themselves.

52 Claims, 22 Drawing Sheets

HEATING THE MAGNETIC FIELD SENSOR STRUCTURES TO SET A PERMANENT MAGNETIZATION OF THE MAGNETIC FIELD SENSOR STRUCTURES, SO THAT, AFTER HEATING, THERE ARE A MULTIPLICITY OF MAGNETORESISTIVE SENSOR ELEMENTS, EACH OF WHICH HAVING A MAIN SENSITIVITY DIRECTION WITH RESPECT TO A PRESENT MAGNETIC FIELD, AND WHEREIN LINES ASSOCIATED WITH THE MAIN SENSITIVITY DIRECTIONS OF THE MAGNETORESISTIVE SENSOR ELEMENTS AND PASSING THROUGH THE MAGNETORESISTIVE SENSOR ELEMENTS INTERSECT IN AN AREA CORRESPONDING TO THE MAGNETIZATION CENTER ~540

FIG 5B

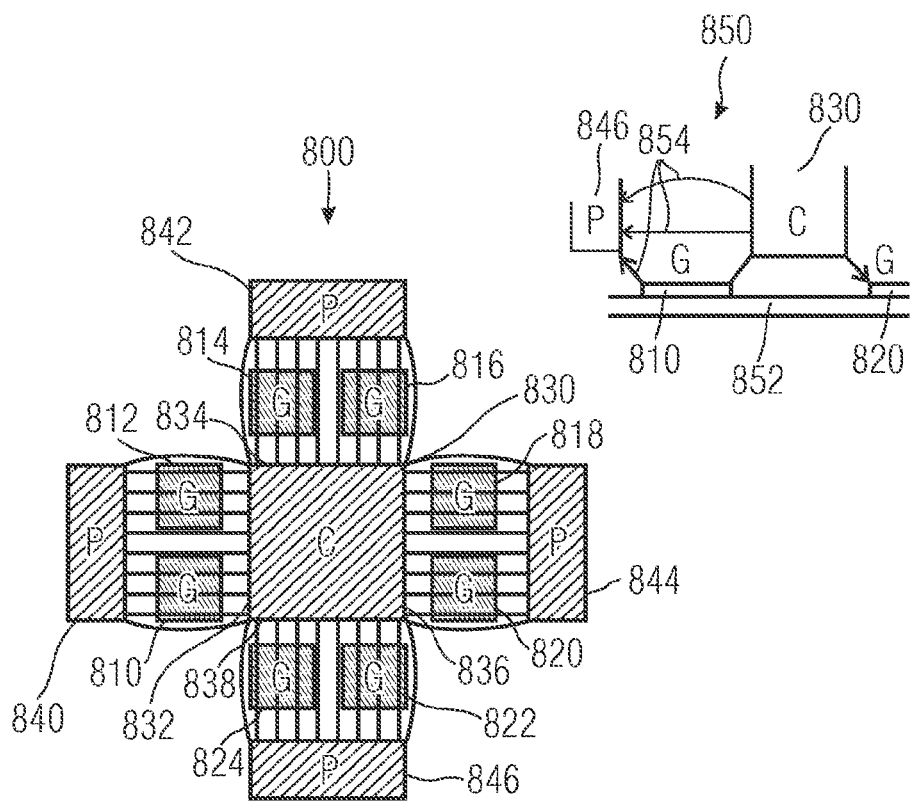
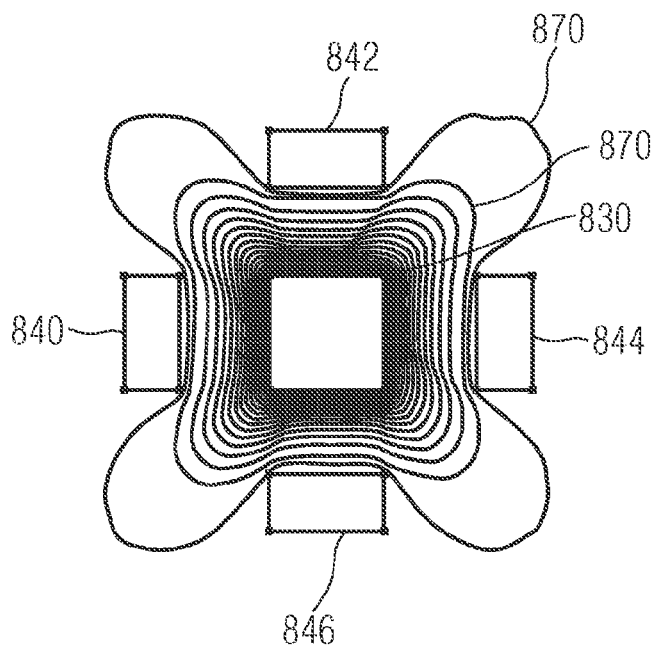
FIG 8A
FIG 8B

US 7,956,610 B2

SENSOR FOR SENSING A MAGNETIC FIELD DIRECTION, MAGNETIC FIELD DIRECTION SENSING, METHOD FOR PRODUCING MAGNETIC FIELD SENSORS, AND WRITE-IN APPARATUS FOR PRODUCING MAGNETIC FIELD SENSORS

This application claims priority from German Patent Application No. 10 2007 021 320.6, which was filed on May 7, 2007, and is incorporated herein in its entirety by reference.

TECHNICAL FIELD

Embodiments of the invention relate to a sensor for sensing a magnetic field direction, to a magnetic field direction sensing for sensing a magnetic field direction, to a method for producing magnetic field sensors, and to a write-in apparatus for producing magnetic field sensors.

SUMMARY OF THE INVENTION

Embodiments of the invention concern a sensor for sensing a magnetic field direction with a plurality of magnetoresistive sensor elements, each of which having a main sensitivity direction with respect to a present magnetic field. Lines associated with the main direction sensitivity of the magnetoresistive sensor elements and passing through the magnetoresistive sensor elements intersect in an area outside the magnetoresistive sensor elements.

Further embodiments of the invention concern a method for producing magnetic field sensors. The method includes providing a carrier as well as arranging a plurality of permanently magnetizable magnetic field sensor structures on the carrier, the permanently magnetizable magnetic field sensor structures having a magnetization minimum temperature. The method further includes generating a magnetic field in which magnetic field lines pass outwardly in various directions starting from a magnetic field sensor, or in which magnetic field lines pass from the outside in various directions toward a magnetic field sensor, so that various ones of the magnetic field sensor structures are penetrated by the magnetic field in various directions. Furthermore, the method includes heating the magnetic field sensor structures to set a permanent magnetization of the magnetic field structures, so that, after heating, there are a plurality of magnetoresistive sensor elements, each having a main sensitivity direction with respect to a present magnetic field, wherein lines associated with the main directions of sensitivity of the magnetoresistive sensor elements and passing through the magnetoresistive sensor elements intersect in an area corresponding to the magnetization center.

Further embodiments of the invention concern a write-in apparatus for producing magnetic field sensors with the magnet formed to generate a magnetic field. In the magnet, magnetic field lines pass outwardly in various directions starting from a magnetic field center, or from the outside in various directions toward the magnetic field center. The write-in apparatus further includes a positioning means formed to position the magnet with respect to a carrier carrying a plurality of magnetic field sensor structures so that various ones of the magnetic field sensor structures are penetrated in various directions by magnetic field lines originating from the magnetic field center or passing toward the magnetic field center. The write-in apparatus further includes an energy source formed to supply the magnetic field sensor elements with energy, in order to enable permanent magnetizations to be set in the magnetic field sensor structures by the magnetic field generated by the magnet.

BRIEF DESCRIPTION OF THE DRAWINGS

Embodiments of the present invention will be detailed subsequently referring to the appended drawings, in which:

FIGS. 5A, 5B show a flow chart of a method for producing magnetic field sensors, according to an embodiment;

FIG. 8A is a schematic illustration of an arrangement for writing a permanent magnetic field into magnetic field sensor structures, according to an embodiment;

FIG. 8B is a schematic illustration of a magnetic field, as it occurs in the arrangement according to FIG. 8A, in form of equipotential lines;

FIG. 10B is a cross-sectional illustration through a magnet according to FIG. 10A, together with magnetic field directions drawn in;

DETAILED DESCRIPTION OF ILLUSTRATIVE EMBODIMENTS

The measurement of a direction in which a magnetic field passes is needed in many applications. For determining a magnetic field direction, for example, magnetoresistive sensors are employed. These sensors include magnetoresistive sensor elements the resistance of which changes depending on a direction of an applied magnetic field.

In the production of some magnetoresistive sensors, it may or may not be necessary to set (to pin) a magnetization in a certain layer. To this end, for example, an external magnetic field is applied, and individual magnetoresistive sensors are heated. In previous solutions, however, setting the magnetization of a layer is a very intensive process. What makes it even more difficult is that, in many sensors, more than one magnetoresistive sensor element is employed for improving the accuracy, whereby the effort in setting the magnetization of a certain layer increases further.

The production effort needed in the production of an angle sensor, of course, is mirrored in the system costs, so that a reduction in the processing effort brings along economic advantages.

Figure 22A:
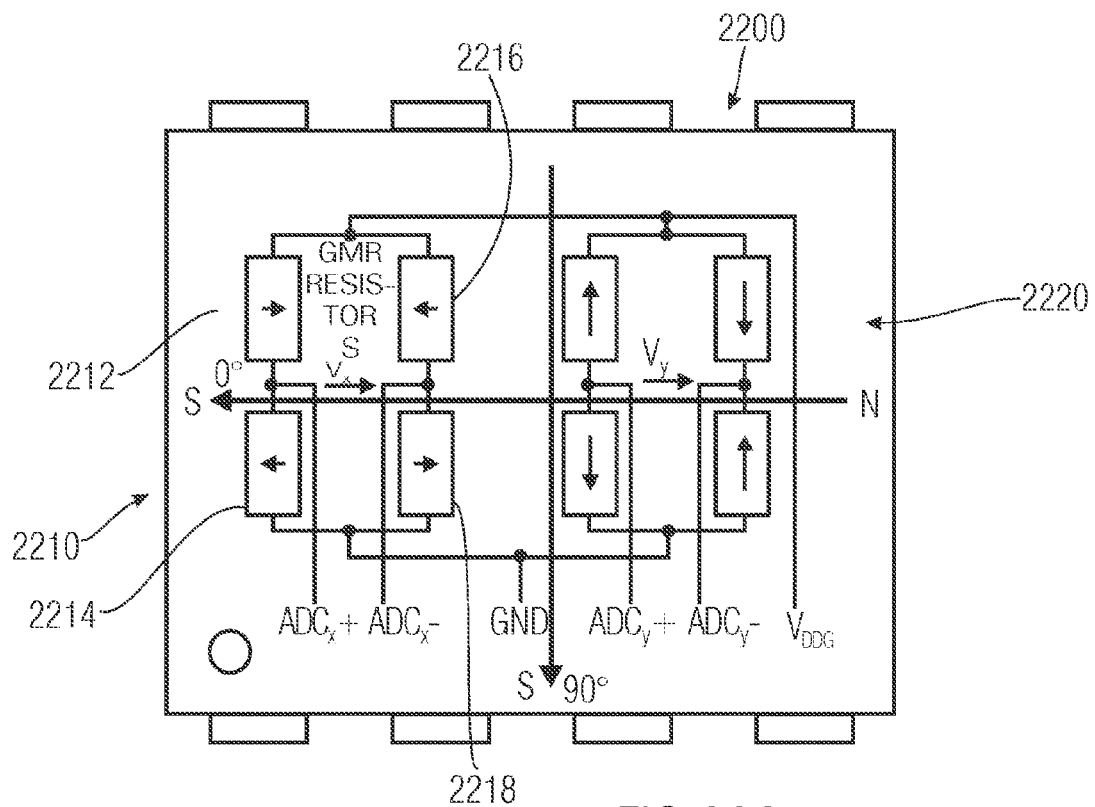
FIG. 22A is a schematic illustration of a GMR sensor bridge capable of being produced with eight write-in processes.

FIG. 22A shows a schematic illustration of a conventional GMR sensor bridge arrangement that can be produced with eight write-in processes. The sensor bridge according to FIG. 22A is designated with 2200 in its entirety. The sensor bridge arrangement 2200 includes a first sensor bridge 2210 including four GMR resistors 2212, 2214, 2216, 2218. A first GMR resistor 2212 and a second GMR resistor 2214 are connected in series between a supply potential $V_{DDG}$ and a reference potential GND. Furthermore, a third GMR resistor 2216 and a fourth GMR resistor 2218 are also connected in series between the supply potential $V_{DDG}$ and the reference potential GND. The first GMR resistor 2212 and the fourth GMR resistor 2218 have the same main sensitivity direction (with respect to an applied external magnetic field). Likewise, the second GMR resistor 2214 and the third GMR resistor 2216 have the same main sensitivity directions. The main sensitivity directions of the first and fourth GMR resistors 2212, 2218 are opposite to the main sensitivity directions of the second and third GMR resistors 2214, 2216. The four GMR resistors 2212, 2214, 2216, 2218 thus form a full bridge. A bridge voltage $V_X$ is tapped via a first tap arranged between the first GMR resistor 2212 and the second GMR resistor 2214 and via a second tap arranged between the third GMR resistor 2216 and the fourth GMR resistor 2218.

Similarly, the GMR bridge arrangement 2200 includes a second GMR bridge 2220. Basically, this is, for example, constructed exactly like the first GMR bridge 2210. The main sensitivity direction of the GMR resistors of the second GMR bridge 2220, however, differ from the main sensitivity directions of the GMR resistors of the first GMR bridge 2210. With this, it is achieved that the first GMR bridge 2210 is sensitive to a magnetic field component in an x direction, for example, whereas the second GMR bridge 2220 is sensitive to magnetic field component in a y direction. For further details regarding the GMR bridge 2200, reference is made to FIG. 22a.

Besides, it is to be pointed out that GMR resistors of the first GMR bridge 2210 as well as the GMR resistors of the second GMR bridge 2220 may be premagnetized in eight separate write-in processes due to the arrangement. In other words, eight individual steps are needed to write a permanent magnetic field into the various GMR resistors.

Figure 22B:
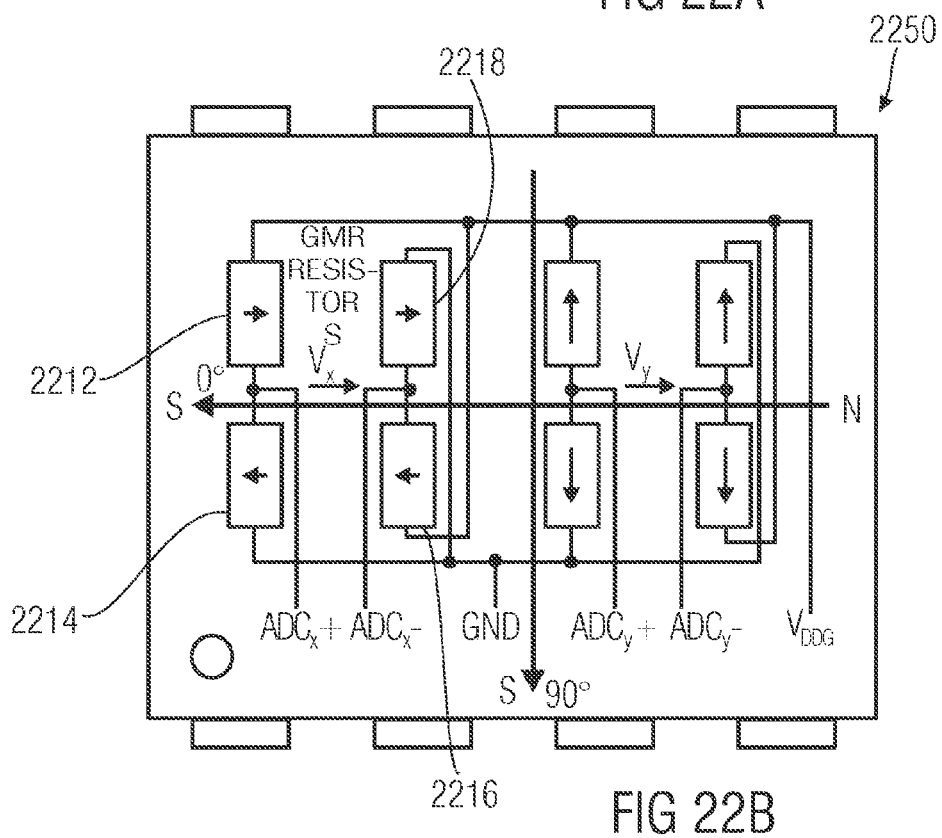
FIG. 22B is a schematic illustration of a GMR sensor bridge with optimized arrangement, capable of being produced with four write-in processes.

FIG. 22B shows a schematic illustration of a further GMR sensor with optimized arrangement, which can be produced by four write-in processes. The GMR sensor according to FIG. 22B is designated with 2250 in its entirety. The GMR sensor 2250 substantially corresponds to the GMR sensor 2200 in terms of its construction. But the spatial arrangement of the GMR resistors is altered. Thus, for example, the first GMR resistor 2212 and the fourth GMR resistor 2218, which have the same main sensitivity directions (and which therefore are also premagnetized with the same externally applied magnetic field), are arranged adjacent to each other. Similarly, the second GMR resistor 2214 and the third GMR resistor 2216 also are arranged adjacent to each other. Thus, the first GMR resistor 2212 and the fourth GMR resistor 2218 may for example be premagnetized in a single step. Likewise, for example, only one step still is needed to premagnetize the second GMR resistor 2214 and the third GMR resistor 2216.

Hence, the sensor 2250 is improved with respect to the sensor 2200 in that the sensor 2250 can be produced with only four write-in processes, for example. In other words, the premagnetization of the GMR sensors (that is the write-in of a permanent magnetic field) can be performed in only four process steps.

In summary, it thus is to be noted that conventional GMR angle sensors in many cases are constructed so that each sensor element may be written-in (or premagnetized) individually. One example for such a sensor is shown in FIG. 22A. The write-in in this case necessitates eight separate write-in processes. One way of improvement is to place two GMR elements with the same write-in direction (i.e., for example, with the same main sensitivity direction) closely to each other (e.g., adjacently). This is shown in FIG. 22B. With this, reduction in the number of write-in processes to four write-in processes is achieved, for example.

Besides, the arrangements shown on the basis of FIGS. 22A and 22B still have comparably great errors. In the centers according to FIGS. 22A and 22B, bridge arrangements are used each. This bridge arrangement results in certain errors, for example, in so-called anisotropy angle errors. Various methods are known to perform anisotropy angle error reduction in GMR sensors for angle measurement applications. Thus, for example, it is possible to reduce an anisotropy error manifesting itself as third harmonic to the actual signal components. Thus, for example, arrangements with which the anisotropy error mentioned can be compensated for computationally are known.

Figure 23:
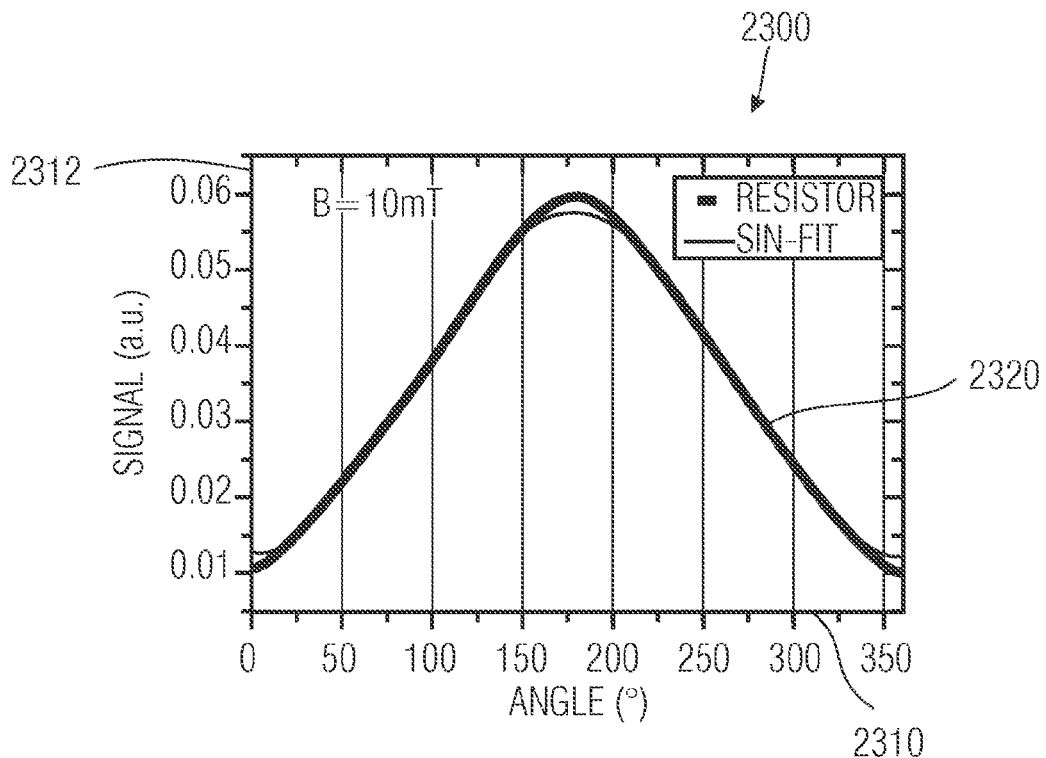
FIG. 23 is a graphical illustration of a triangular distortion of trigonometric component signals.

Besides, FIG. 23 shows a graphical illustration of a triangular distortion of trigonometric component signals due to a third harmonic. The graphical illustration of FIG. 23 is designated with 2300 in its entirety. On the abscissa 2310, an angle is entered in degrees, and an ordinate 2312 describes a signal in arbitrary units. A curve 2320 shows a distorted trigonometric signal, which may, for example, be an output signal of a GMR bridge.

Figures 24A, 24B:
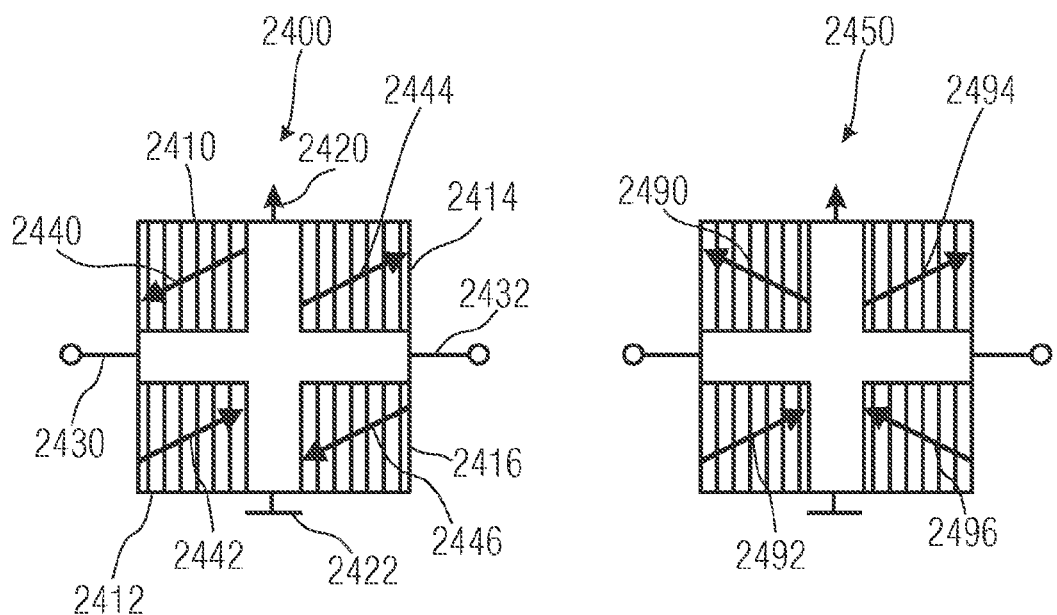
FIGS. 24A, 24B are schematic illustrations of GMR write-in directions for improving hysteresis and an anisotropy error.

Besides, FIGS. 24A and 24B show schematic illustrations of GMR arrangements in which GMR write-in directions are chosen in a certain way for improvement of hysteresis and anisotropy errors. The arrangement according to FIG. 24A is designated with 2400 in its entirety, the arrangement according to FIG. 24B is designated with 2450 in its entirety. The arrangement 2400 includes four GMR sensor elements 2410, 2412, 2414, 2416. The GMR sensor elements 2410, 2412, 2414, 2416 are connected in a full bridge, for example. To this end, the arrangement 2400 is coupled to a first supply potential 2420 and a second supply potential 2422, wherein the first GMR sensor element 2410 and the second GMR element 2412 are connected in series between the first supply potential 2420 and the second supply potential 2422. A tap between the first GMR sensor element 2410 and the second GMR element 2412 serves as a first output terminal 2430. The third GMR sensor element 2414 and the fourth GMR sensor element 2416 are also connected in series between the first supply potential 2420 and the second supply potential 2422, wherein a tap 2432 provides a second output signal. Besides, it is assumed that FIG. 24A shows a schematic illustration of a top view onto the arrangement 2400. Arrows 2440, 2442, 2444, 2446 symbolize GMR write-in directions. Thus, for example, the first GMR sensor element 2410 and the second GMR element 2412 have opposite GMR write-in directions. Likewise, the third GMR sensor element 2414 and the fourth GMR sensor element 2416 have opposite GMR write-in directions. Besides, an especially small anisotropy error is achieved by the GMR write-in directions being chosen obliquely with respect to the meander-shaped structure of the GMR sensors, as this can be seen in the graphical illustration of FIG. 22A.

Furthermore, it can be seen from FIG. 22A that all GMR write-in directions may be chosen to be parallel or antiparallel, for example.

FIG. 24B shows a further arrangement of GMR sensor elements, which are connected in a bridge. The connection of the GMR sensor elements in the arrangement 2450 corresponds to the connection of the GMR sensor elements in the arrangement 2400. But the GMR write-in directions are changed. Besides, the GMR write-in directions are designated by arrows 2490, 2492, 2494, 2496. It can be seen from the schematic illustration of FIG. 24B that various GMR write-in directions may be used, for example. Two GMR sensor elements, for example, have the same GMR write-in direction, while two further GMR sensor elements have another write-in direction. The various write-in directions do not necessarily have to be parallel or antiparallel, but may also be chosen arbitrarily, so that an angle between the different GMR write-in directions is different from 0° or from 180°.

Besides, on the basis of FIGS. 24A and 24B, there is emphasized a method to reduce a hysteresis error and/or an anisotropy error by non-orthogonal write-in (of write-in directions in magnetoresistive sensors).

Figure 25:
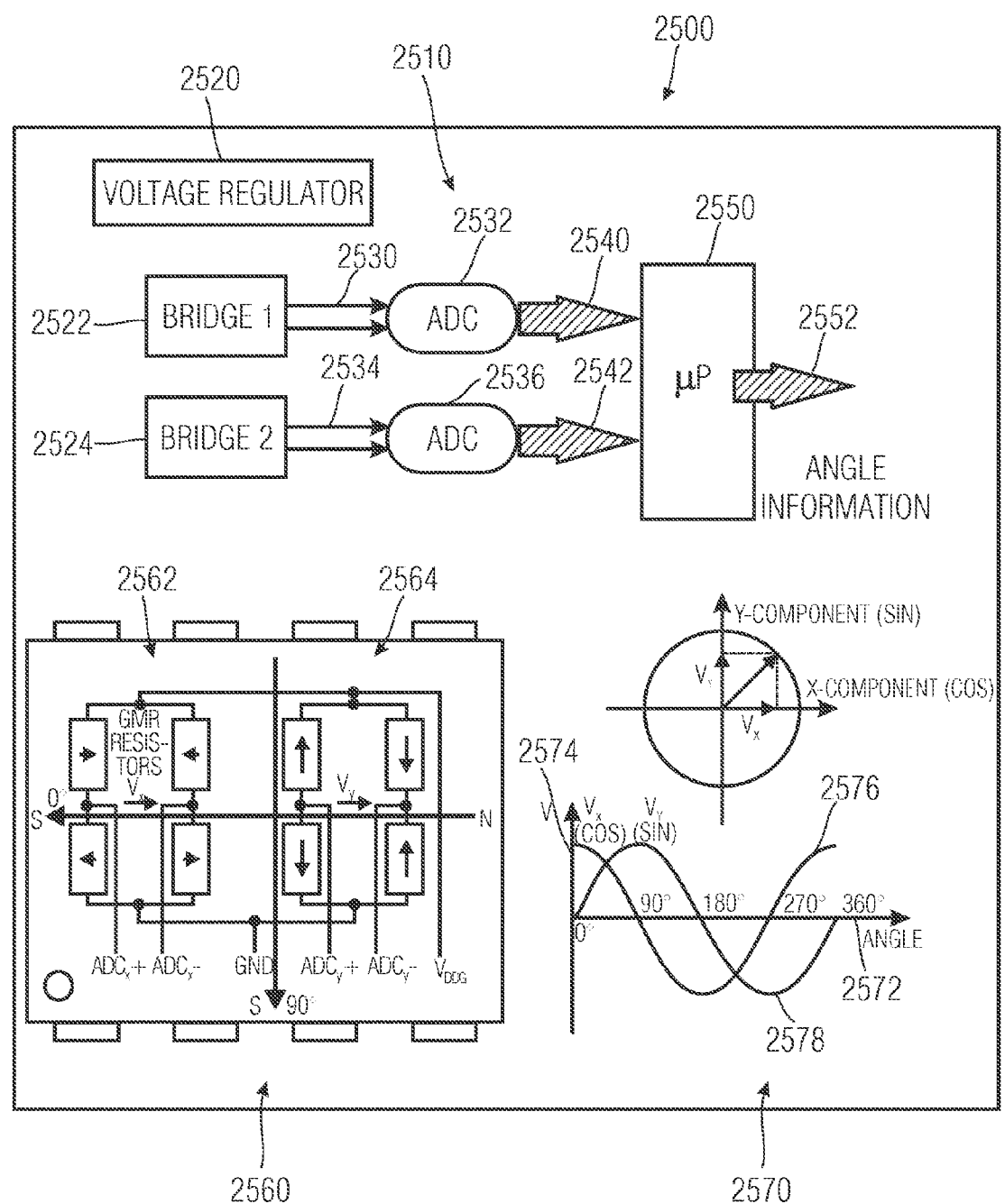
FIG. 25 is an overview illustration of the architecture of an angle sensor based on magnetoresistive sensor elements.

Besides, FIG. 25 shows a schematic illustration of a conventional angle sensor based on magnetoresistive elements. The schematic illustration of FIG. 25 is designated with 2500 in its entirety. A block circuit diagram 2510 describes an angle sensor system. The system according to the block circuit diagram 2510 includes a voltage regulator 2520, which supplies one or more supply potentials for two bridges or bridge circuits 2522, 2524. The first bridge 2522 provides one or more output signals 2530 to a first analog-digital converter 2532. The second bridge 2524 provides one or more output signals 2534 to a second analog-digital converter 2536. The first analog-digital converter 2532 converts the signals 2530 provided from the first bridge 2522 to a digital value 2540. Likewise, the second analog-digital converter 2536 converts the signals 2534 provided from the second bridge 2524 to a second digital value 2542. A microprocessor 2550 calculates angle information 2552 describing in which angle a magnetic field penetrates the sensor arrangement, for example, based on the two digital values 2540, 2542.

A schematic illustration 2560, for example, describes how the first bridge 2522 and the second bridge 2524 may be formed by GMR sensor elements or GMR resistors. For example, a first arrangement 2562 may form the first bridge 2522. Furthermore, a second arrangement 2564 may form the second bridge 2524. The two arrangements 2562, 2564 of GMR sensor elements or GMR resistors also, for example, have different main sensitivity directions. In other words, the arrangement 2562 is substantially sensitive to a magnetic field component in a first direction, whereas the second arrangement 2564 is substantially sensitive to a magnetic field component in a second direction different from the first direction. Furthermore, it is to be pointed out that the arrangement 2560 may, for example, correspond to the arrangements shown on the basis of FIGS. 22A and 22B.

Besides, a graphical illustration 2560, for example, describes signals provided from the first bridge 2522 and from the second bridge 2524. An abscissa 2572 describes an angle under which a magnetic field component (e.g., a magnetic field component in a plane in which the GMR sensor elements are arranged) is incident with respect to a zero direction. Besides, an ordinate 2574 describes a signal level of output signals of the bridges 2522, 2524. A first curve 2576, for example, describes a signal level of an output signal of the first bridge 2522, and a second curve 2578, for example, describes a signal level of an output signal of the second bridge 2524. From the graphical illustration 2570, it can be seen that the signal 2576, at least in an idealized case, approximately has a cosine-shaped angle dependency. Besides, the signal 2578, in an idealized case or approximately, has a sinusoidal angle dependency (on the angle of the magnetic field component considered).

In summary, it may be stated that the graphical illustration 2500 shows a typical block diagram 2510 for angle sensors and/or for an angle sensor architecture based on magnetoresistive elements. Both blocks 2522 ("bridge 1"), 2524 ("bridge 2"), for example, are Wheatstone-type bridges the resistors of which are replaced by magnetoresistive elements. The signals $u_1$ and $u_2$ (which physically are in phase quadrature) are voltages and also are a function of a mutual orientation between an internal magnetization and an externally applied magnetic field. Both signals (i.e., for example, an output signal 2530 of the first bridge 2522 and an output signal 2534 of the second bridge 2524) are converted into digital numbers or values 2540, 2542 and processed by a processor for calculating the above-described angle.

Here, it is the idea to calculate an arc tangent of a quotient between $u_1$ and $u_2$ ($u_1/u_2$), the desired angle, that is. The magnetoresistive bridges 2522, 2524 are, for example, arranged at a center or in a middle of an integrated circuit (IC). A layout of the magnetoresistive bridges, for example, further is designed to minimize an area. For reasons of sensitivity, for example, each resistor is offset to minimize output differential voltage.

Although the architecture described on the basis of FIG. 25 works rather well, it does suffer from at least two great disadvantages: the use of a microprocessor and the necessity of a multi-step magnetization.

With respect to the first disadvantage, it is to be pointed out that a microprocessor is a block with very high area need. Furthermore, a microprocessor needs a certain time to carry out a computation. Thus, a comparably slow response results, for example. For this reason, the microprocessor typically is an external block, which significantly increases the system costs.

With respect to the second disadvantage, it is to be pointed out that a polarization procedure using several steps of local heating (e.g., laser-based or laser-driven) using a magnetic field control may be implemented, because every magnetoresistive element may have a different magnetization, for example. Apart from cost factors and time factors, this also brings along significant risks for the circuitry below and around the sensitive elements (e.g., diffraction effects and thermal gradients).

Hence, there is a need to provide a "topological" alternative to the conventional arrangements.

Figure 1A:
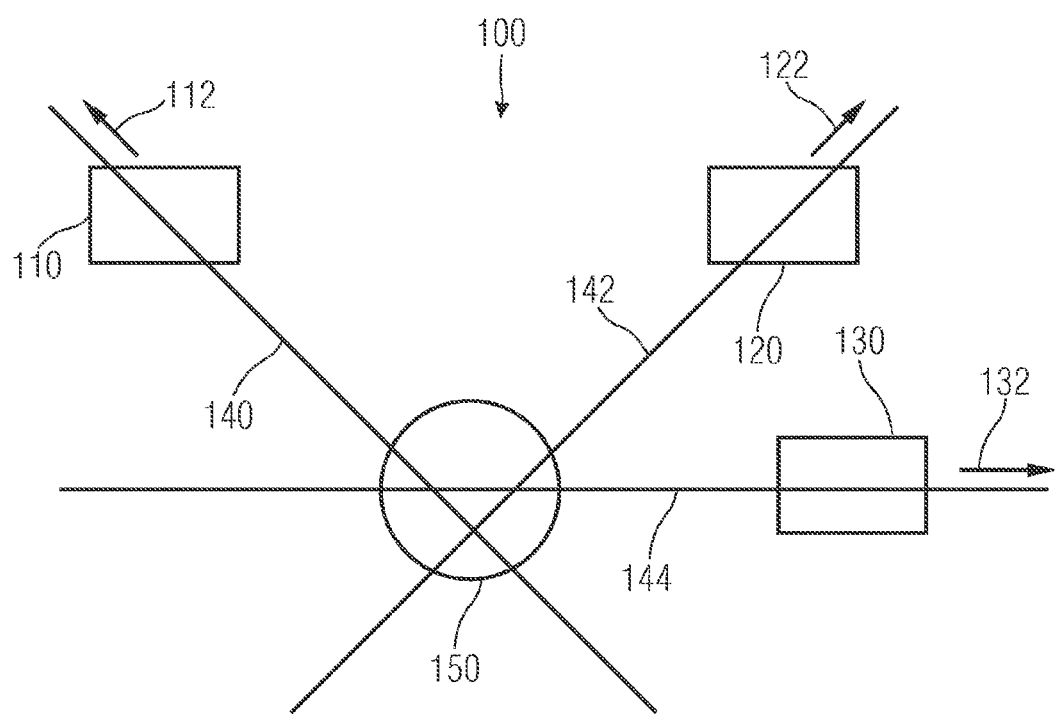
FIGS. 1A, 1B are schematic illustrations of sensors for sensing a magnetic field direction, according to embodiments.
Figure 1B:
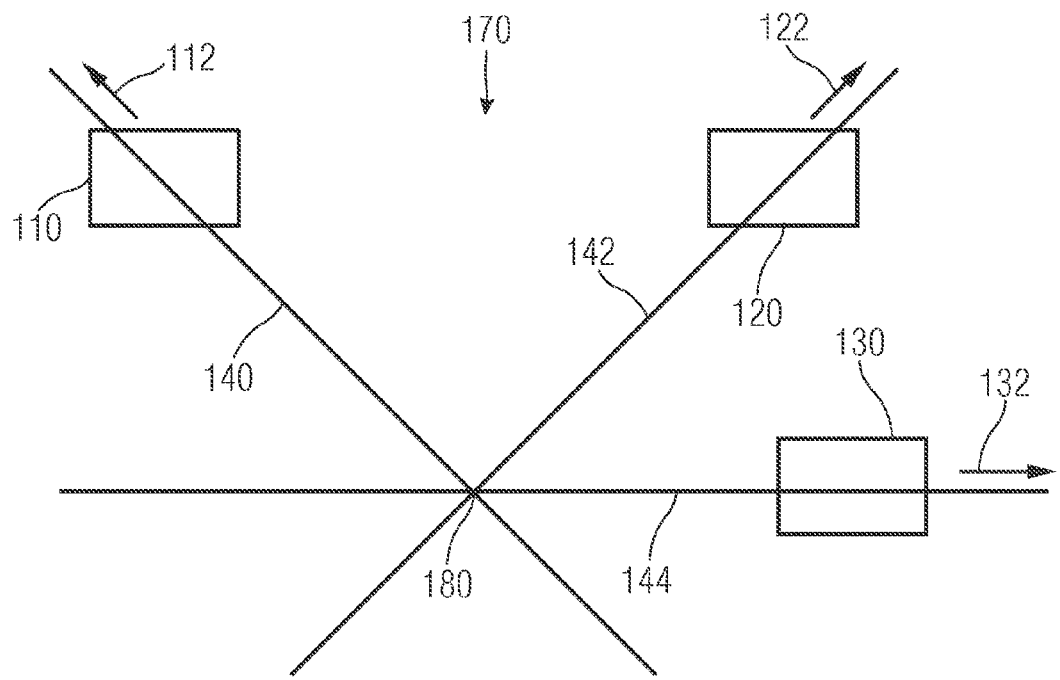

FIGS. 1A, 1B, collectively FIG. 1, shows a schematic illustration of a sensor for sensing a magnetic field direction according to an embodiment. The sensor according to FIG. 1A is designated with 100 in its entirety. The sensor 100 includes a plurality (at least three, that is) of magnetoresistive sensor elements. A first magnetoresistive sensor element 110 has a first main sensitivity direction 112 with respect to a present magnetic field B. A second magnetoresistive sensor element 120 has a second main sensitivity direction 122 with respect to a present magnetic field B. A third magnetoresistive sensor element 130 has a third main sensitivity direction 132 with respect to a present magnetic field B. A first line 140 passing through the first magnetoresistive sensor element 110 and having its direction set by the first main sensitivity direction 112 is associated with the magnetoresistive sensor element 110. In other words, the direction of the first line, for example, is parallel to the first main sensitivity direction 112. A second line 142 passing through the second magnetoresistive sensor element 120 is associated with the second magnetoresistive sensor element 120. A direction of the second line 142 is set by the second main direction of sensitivity 122. For example, the second line 142 is parallel to the second main sensitivity direction 122. A third line 144 passing through the third magnetoresistive sensor element 130 is associated with the third magnetoresistive sensor element 130. A direction of the third line 144 is associated with the third main sensitivity direction 132. For example, the direction of the third line 144 is parallel to the direction of the third main sensitivity direction.

The three lines 140, 142, 144 associated with the magnetoresistive sensor elements 110, 120, 130 intersect in an area 150 outside the magnetoresistive sensor elements themselves. In other words, there is an intersection area in which the lines 140, 142, 144 converge.

The corresponding arrangement has the advantage, as compared with conventional arrangements, that the area in which the lines intersect may be regarded as a magnetization center. For example, if the magnetoresistive sensor elements 110, 120, 130 are not yet premagnetized during the production, and if at least an approximately radially symmetrical magnetic field is applied, the center of which is in the area in which the lines 140, 142, 144 intersect, the magnetoresistive sensor elements 110, 120, 130 may be magnetized and/or "written in" with a premagnetization in a single process step and/or by applying a single magnetic field, for example. In other words, due to the corresponding magnetization for directions or main sensitivity directions 112, 122, 132, the direction of which is described by the lines 140, 142, 144, especially simple, quick and inexpensive production of the sensor 100 is possible.

In other words, the orientation of the main sensitivity directions, which, for example, all are oriented away from the area 150, or which, for example, are all oriented toward the area 150, may be achieved by a radially symmetrical magnetic field, the center of which coincides with the area 150 or is adjacent to the area 150.

Furthermore, the arrangement according to FIG. 1A, for example, allows for the production of magnetoresistive angle sensors with particularly small trapezoidal distortion of component signals, wherein the production again is possible in quick and inexpensive manner.

FIG. 1B shows a schematic illustration of a further sensor, according to a further embodiment. The sensor according to FIG. 1B is designated with 170 in its entirety. Since the sensor 170 is very similar to the sensor 100 according to FIG. 1A, the same means, directions and lines are designated with the same reference numerals. The embodiment according to FIG. 1B differs from the embodiment according to FIG. 1A in that the three lines 140, 142, 144 (which are defined as described above) intersect at a single point 180. The sensor 170 according to FIG. 1B thus represents an idealization of the sensor 100 according to FIG. 1A. Thus, the intersection 180 takes the place of the area 150. In this respect, it is to be pointed out that the area 150 substantially describes tolerances developing by not ideal orientation or arrangement of the sensor elements 110, 120, 130 in one embodiment. Thus, in an embodiment of the present invention, the area 150 is small as compared with the distances of the sensor elements 110, 120, 130. In one embodiment, the maximum dimension (for example, a diameter) of the area 150 is no more than 10% of a maximum distance between two magnetoresistive sensor elements 110, 120, 130 belonging to the sensor. In a further embodiment, the maximum dimension of the area 150 is no more than 1% of a maximum distance between two magnetoresistive sensor elements belonging to the sensor.

In other words, in some embodiments of the present invention, the area or intersection area 150 is very small as compared with the sensor structure (the dimensions of which are defined by maximum distances between two sensor elements belonging to the sensor).

The more the magnetic field used for writing in on the main sensitivity direction 112, 122, 132 approaches an ideal radially symmetrical structure, the smaller the area 150.

Figure 2:
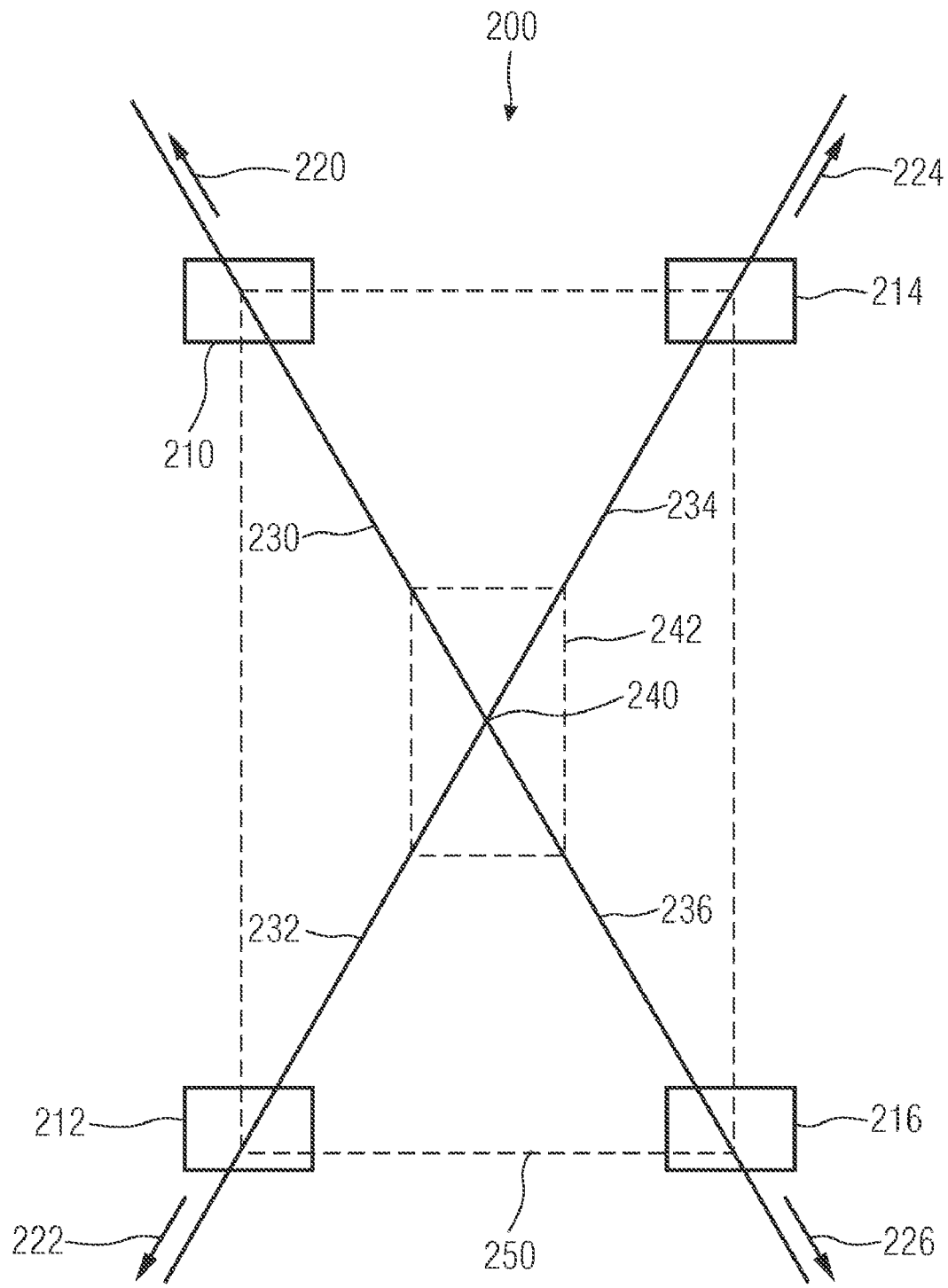
FIG. 2 is a schematic illustration of a further sensor for sensing a magnetic field direction, according to an embodiment.

FIG. 2 shows a schematic illustration of a further sensor for sensing a magnetic field direction according to a further embodiment. The sensor according to FIG. 2 is designated with 200 in its entirety. The sensor 200 includes a first magnetoresistive sensor element 210, a second magnetoresistive sensor element 212, a third magnetoresistive sensor element 214 and a fourth magnetoresistive sensor element 216. The first magnetoresistive sensor element 210 has a first main sensitivity direction 220, the second magnetoresistive sensor element 212 has a second main sensitivity direction 222, the third magnetoresistive sensor element 214 has a third main sensitivity direction 224, and the fourth magnetoresistive sensor element 216 has a fourth main sensitivity direction 226. A line 230 passing through the first magnetoresistive sensor element 210 and having its direction pinned by the main sensitivity direction 220 is associated with the first sensor element 210. Furthermore, a corresponding line 236 passing through the fourth magnetoresistive sensor element and having its direction defined by the main sensitivity direction 226 is associated with the fourth magnetoresistive sensor element 216. In an ideal case, the lines 230, 236 coincide (are identical, that is). The corresponding ideal case is shown in FIG. 2. But the lines 230, 236 may also (slightly) deviate from each other. Similarly, corresponding lines 232, 234, which coincide in the ideal case and otherwise (at least in an area between the magnetoresistive sensor elements) pass closely adjacent to each other, are associated with the second magnetoresistive sensor element 212 and the third magnetoresistive sensor element 214.

In the ideal case shown in FIG. 2, for example, the lines 230, 232, 234, 236 intersect in an intersection point 240. But the lines may also intersect in an intersection area 242, the tolerance limits of which correspond to the ones defined above. Besides, it is to be pointed out that, of course, intersection points of parallel or almost parallel lines do not have to lie within the intersection area 240. For example, if the lines defined by the first magnetoresistive sensor 210 and by the fourth magnetoresistive sensor element 216 (in general: lines defined by magnetoresistive sensors opposite to each other with respect to the intersection area 242) are approximately parallel, the intersection point of these approximately parallel lines may also lie outside the intersection area 242. But in the arrangement 200 according to FIG. 2, at least four intersection points of the lines 230, 232, 234, 236 lie within the intersection area 242, for example, (wherein a total of six intersection points exist, if the lines are all different from each other).

In the embodiment according to FIG. 2, the intersection area 242 further lies at a center between the magnetoresistive sensor elements 210, 212, 214, 216. Thus, it can be noted that the magnetoresistive sensor elements 210, 212, 214, 216 surround the intersection area 242. The lines mentioned (apart from approximately parallel lines) thus intersect in an intersection area 242 surrounded by the magnetoresistive sensor elements 210-216. Furthermore, it is to be pointed out that two magnetoresistive sensor elements each (e.g., the first magnetoresistive sensor element 210 and the fourth magnetoresistive sensor element 216) are arranged so that they are substantially point-symmetrical (for example, with a deviation of maximum of 20%) with respect to the intersection area 242, for example. The point symmetry may, for example, be defined as follows: a central point between two opposite (i.e., approximately point-symmetrical with respect to each other) magnetoresistive sensor elements lies within the intersection area 242, wherein the intersection area 242 is assumed to be a circular area. A central point of the circular area mentioned, for example, corresponds to a center of gravity of intersection points of the lines 230, 232, 234, 236, wherein intersection points between lines that are different with respect to each other, but approximately parallel with respect to each other, remain unconsidered. The radius of the circular area here, for example, is 20% with respect to a maximum dimension between magnetoresistive sensor elements belonging to the sensor. In another embodiment, the radius of the circular area only is 10% or only 1% of the distance between two magnetoresistive sensor elements belonging to a sensor.

In one embodiment, the magnetoresistive sensor elements 210, 212, 214, 216 are at least approximately at four corners of a rectangle 250, which is illustrated in dashed lines in FIG. 2. There may of course also be tolerances here. For example, it may be defined that four magnetoresistive sensor elements lie approximately on the corners of a sensor if there exists a rectangle so that center points of four different magnetoresistive sensor elements are not further away from respectively associated corner points of the rectangle than a maximum allowable distance. The maximum allowable distance, for example, is 10% of the length of a (e.g., longer) rectangle side. In one embodiment, the main sensitivity directions of all magnetoresistive sensors 210, 212, 214, 216 are oriented away from the center point of the rectangle 250. In another embodiment, however, the main sensitivity directions of all four magnetoresistive sensor elements 210-216 are oriented toward the center point of the rectangle 250. Furthermore, it is to be pointed out that the four magnetoresistive sensor elements 210, 212, 214, 216 may, for example, be connected together into a bridge circuit. Thus, there results a magnetic field sensor designed for sensing a magnetic field in an advantageous direction. Since the main sensitivity directions of the various magnetoresistive sensor elements further are inclined against each other (for example, the main sensitivity direction 220 is inclined with respect to the main sensitivity direction 224), thus there develops a magnetic field sensor with particularly good properties regarding an anisotropy error. Furthermore, the corresponding magnetic field sensor is substantially point-symmetrical (e.g., apart from the above-described tolerances), so that particularly good properties result. Besides, the corresponding symmetry facilitates the production. Thus, the corresponding sensor may be produced by applying, for example, a radially symmetrical magnetic field the axis of which at least approximately passes through the center point of the rectangle 250. By the magnetic field mentioned, for example, all four of the magnetoresistive sensor elements 210-216 may be premagnetized. Thus, the production of the magnetic field sensor 200, for example, only necessitates applying a single magnetic field configuration, whereby the production effort reduces as opposed to conventional sensors, for example.

Figure 3:
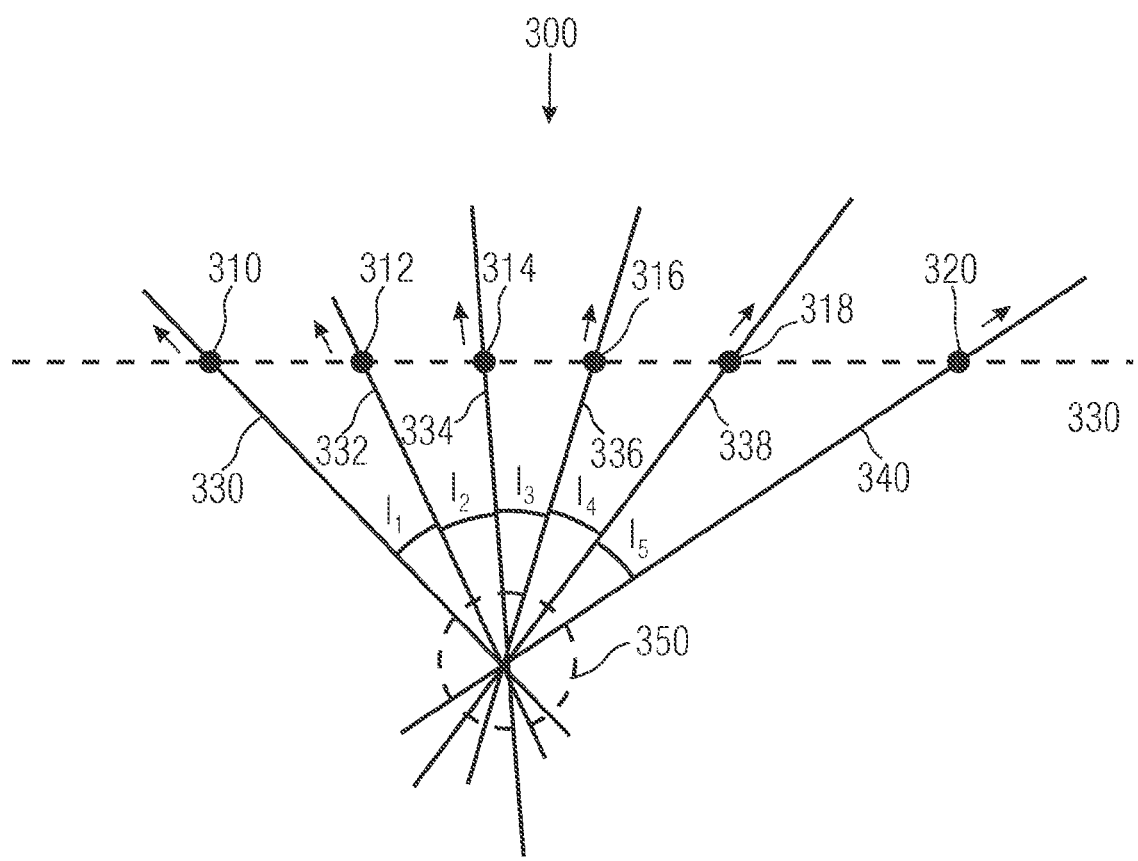
FIG. 3 is a schematic illustration of a further sensor for sensing a magnetic field direction, according to a further embodiment.

FIG. 3 shows a further schematic illustration of a sensor for sensing a magnetic field direction according to a further embodiment. The sensor according to FIG. 3 is designated with 300 in its entirety. The sensor 300 includes a plurality of magnetoresistive sensor elements 310, 312, 314, 316, 318, 320, for example all arranged along a single line 330. Taking tolerances into account, for example, it may be found that neither of the magnetoresistive sensor elements 310-320 has a distance from the line 330 greater than 20% of the distance between two adjacent magnetoresistive sensor elements. Lines defined by the magnetoresistive sensor elements 310-320, each passing through the magnetoresistive sensor element concerned, and the direction thereof corresponding to the main sensitivity direction of the corresponding magnetoresistive sensor element, are designated with 330-340. The lines mentioned intersect in an intersection area 350, for example. A maximum dimension of the intersection area in which the lines 330-340 intersect, for example, is smaller than a distance between two adjacent magnetoresistive sensor elements 310-320. In the embodiment, the main sensitivity directions of the magnetoresistive sensor elements 310-320 change in an approximately linear manner. In other words, if it is assumed that magnetoresistive sensor elements are numbered consecutively along the line 330, an angle $\rho_1$ between the main sensitivity directions of the i-th magnetoresistive sensor element and of the (i+1)-th sensor element differs from an angle $\rho_2$ between the main sensitivity directions of a j-th and a (j+1)-th magnetoresistive sensor element by no more than 10%, with $|i-j|=1$.

Besides, the corresponding arrangement leads to the fact that magnetoresistive sensor elements 310-320 are not arranged equidistantly or approximately equidistantly, but that the distances between two adjacent magnetoresistive sensor elements vary along the line 330.

Besides, the arrangement 300 brings along the advantage that the arrangement is particularly easy to produce. For example, if a radially symmetrical magnetic field is positioned so that the axis of the (at least approximately) radially symmetrical magnetic field passes through the intersection area 350, the magnetoresistive sensor elements 310-320 may be premagnetized by the radially symmetrical magnetic field in a single working step (using a single magnetic field, that is). Thus, efficient and inexpensive production of the sensor 300 is possible. A linear change of the main sensitivity directions also allows for the implementation of a magnetic field sensor with constant resolution. In other words, in an entire angle area covered by the magnetic field sensor, there are several magnetic field sensor elements with corresponding, approximately uniformly distributed main sensitivity directions. Details with respect to the evaluation of the signals provided from the magnetoresistive sensor elements 310-320 still will be described in the following.

Furthermore, it is to be pointed out that in one embodiment the main sensitivity directions of all magnetoresistive sensor elements 310-320 are oriented away from the area 350. In another embodiment, the main sensitivity directions of all magnetoresistive sensor elements 310-320 are oriented toward the intersection area 350.

Figure 4:
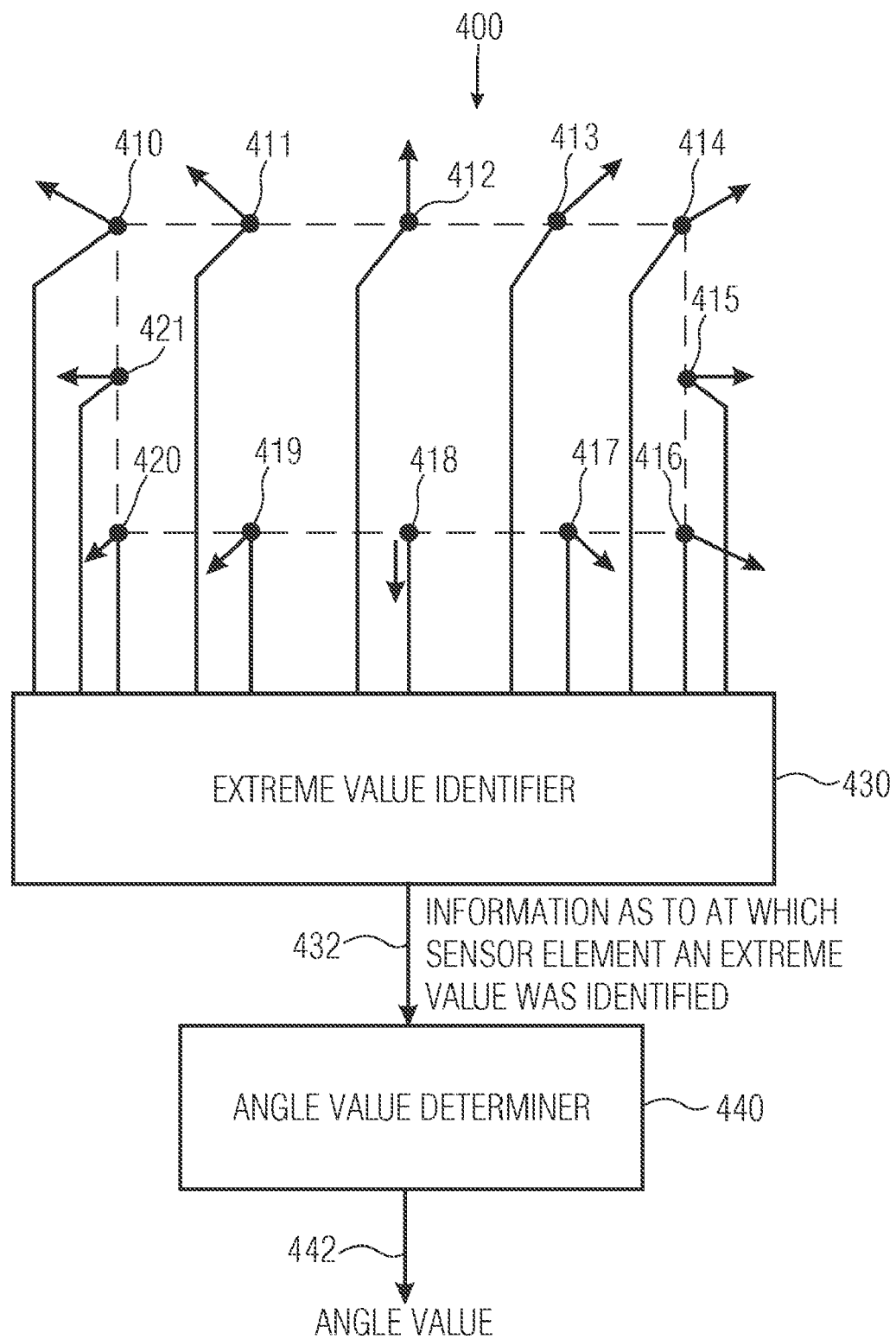
FIG. 4 is a block circuit diagram of a magnetic field direction sensing, according to an embodiment.

FIG. 4 shows a block circuit diagram of a magnetic field direction sensing for sensing a magnetic field direction according to an embodiment of the present invention. The magnetic field direction sensing according to FIG. 4 is designated with 400 in its entirety. The magnetic field direction sensing 400 includes a plurality (at least three, that is) of magnetoresistive sensor elements 410-421. Each of the magnetoresistive sensor elements 410-421 has a main sensitivity direction with respect to a present magnetic field. Lines associated with the main sensitivity directions of the magnetoresistive sensor elements and passing through the magnetoresistive sensor elements also intersect in an area outside the magnetoresistive sensor elements themselves, as this was already explained above. The intersection area, for example, has one of the tolerances described above with respect to the intersection areas.

Furthermore, in an embodiment of the present invention, main sensitivity directions of all magnetoresistive sensor elements are directed away from the intersection area. Alternatively, in a further embodiment, main sensitivity directions of all magnetoresistive sensor elements are directed toward the intersection area.

Thus, there are magnetoresistive sensor elements with at least three different main sensitivity directions with respect to a present magnetic field.

The magnetic field direction sensing 400 further includes an extreme value identifier 430, the inputs of which are coupled to the magnetoresistive sensor elements 410-421. The extreme value identifier 430 is formed to determine which of the magnetoresistive sensor elements 410-421 provides a maximum signal. As an alternative thereto, the extreme value identifier 430 may also be formed to determine which of the magnetoresistive sensor elements provides a minimum voltage signal or a minimum current signal. Furthermore, the extreme value identifier 430 may be formed to determine in which of the magnetoresistive sensor elements the present resistance differs least or most from a nominal resistance (for example, from a resistance without present external magnetic field). Here, the extreme value identifier may, for example, evaluate an absolute or a relative resistance change. Furthermore, the extreme value identifier may evaluate both a maximum value of a resistance deviation and, alternatively or additionally, a minimum value of a resistance deviation.

The extreme value identifier 430 thus provides information 432 as to at which sensor element an extreme value was identified. The information 432 thus describes which of the magnetoresistive sensor elements 410-421 responds most strongly or most weakly to a present external magnetic field. The magnetic field direction sensing 400 further includes an angle determiner 440, which is formed to provide information 442 on an angle value based on the information 432. The angle value determiner 440 thus is formed to convert the information 432 as to at which sensor element an extreme value is identified into the information 442 on the angle value. The conversion may for example include recoding or linear mapping, in the simplest case.

The arrangement mentioned thus enables a direction of an applied external magnetic field to be determined without using a complex computation means evaluating a trigonometric function. Rather, for example, only an extreme value decision is made by the extreme value identifier 430, on the basis of which information 442 on an angle value is determined using a comparably simple mapping rule with a single input quantity (information as to at which sensor element an extreme value was identified).

Thus, a precise angle determination may be performed by the arrangement according to the invention at very little current consumption and without using a complex algorithmic unit, for example.

Figure 5A:
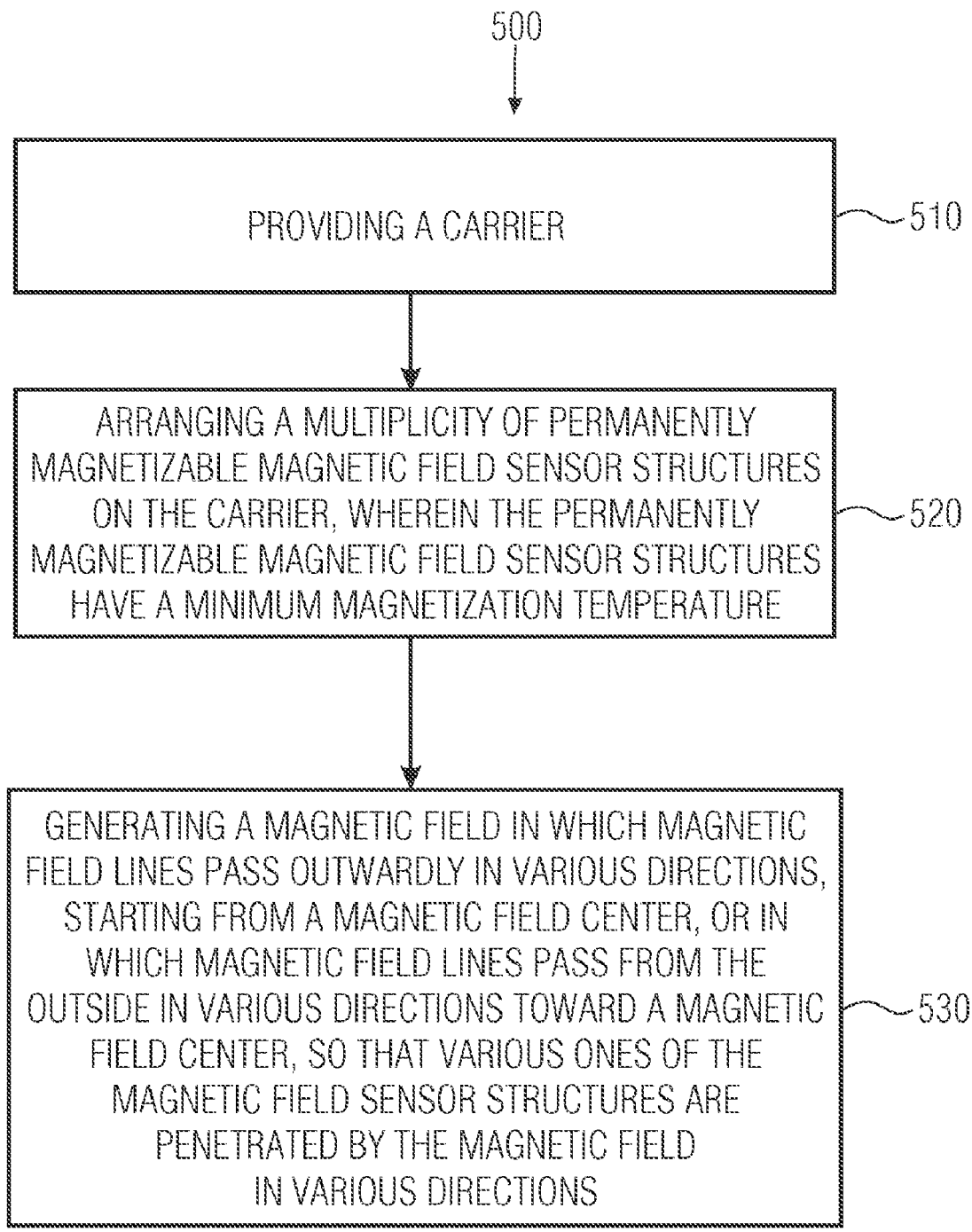

FIG. 5A shows a flow chart of an inventive method for producing magnetic field sensors. The method according to FIG. 5A is designated with 500 in its entirety. The method 500 includes providing a carrier in a first step 510. The method 500 further includes arranging a multiplicity of permanently magnetizable magnetic field sensor structures on the carrier in a second step 520. The permanently magnetizable magnetic field sensor structures here have a magnetization minimum temperature.

In a third step 530, a magnetic field in which magnetic field lines pass outwardly in various directions starting from a magnetic field center 612 (e.g., a central pole of a magnet), or in which magnetic field lines pass from the outside to a magnetic field center 612 in various directions, is generated in a third step 530, so that various ones of the magnetic field sensor structures are penetrated by the magnetic field in various directions.

FIG. 5B further shows a further method step 540. In the step 540, the magnetic field sensor structures are heated to set a permanent magnetization of the magnetic field sensor structures. The heating is done so that, after heating, there are multiplicity of magnetoresistive sensor elements, each of which having a main sensitivity direction with respect to a present magnetic field, wherein lines associated with the main sensitivity directions of the magnetoresistive sensor elements and passing through the magnetoresistive sensor elements intersect in an area corresponding the magnetization center.

The method 500 according to FIGS. 5A and 5B thus enables a plurality of magnetoresistive sensors with different main sensitivity directions to be produced in a single magnetization step or using a single magnetic field. This is made possible by the fact that, in the magnetic field, the magnetic field lines pass outwardly away from a magnetic field center in various directions or pass toward the magnetic field center in various directions. Thus, in a surrounding of the magnetic field center, there are several magnetic field directions strongly differing from each other, by which several permanently magnetizable magnetic field sensor structures may be permanently magnetized. Furthermore, it is to be pointed out that a magnetic field in which magnetic field lines pass outwardly from a magnetic field center in various directions, or vice versa, is especially simple to generate. This is due to the property of the magnetic field lines that they do not intersect in any case and further form closed line courses. Moreover, it is to be pointed out that the use of a corresponding magnetic field, in which magnetic field lines pass in various directions from a magnetic field center also is particularly favorable in terms of fabrication tolerances. From the at least approximately radially symmetrical field structure, particularly small magnetic field direction errors result when the magnetic field center is not positioned completely at the default ideal position.

A particular advantage of the method consists in the fact that, in the presence of a single magnetic field, several magnetic field sensor structures may be magnetized. Thus, in a single magnetization step, several magnetoresistive sensor elements develop. With this, fabrication efficiency may be enhanced significantly as compared with conventional methods. Both time and cost may be saved, whereby efficiency in a production of magnetoresistive sensor elements can be improved.

Figure 6:
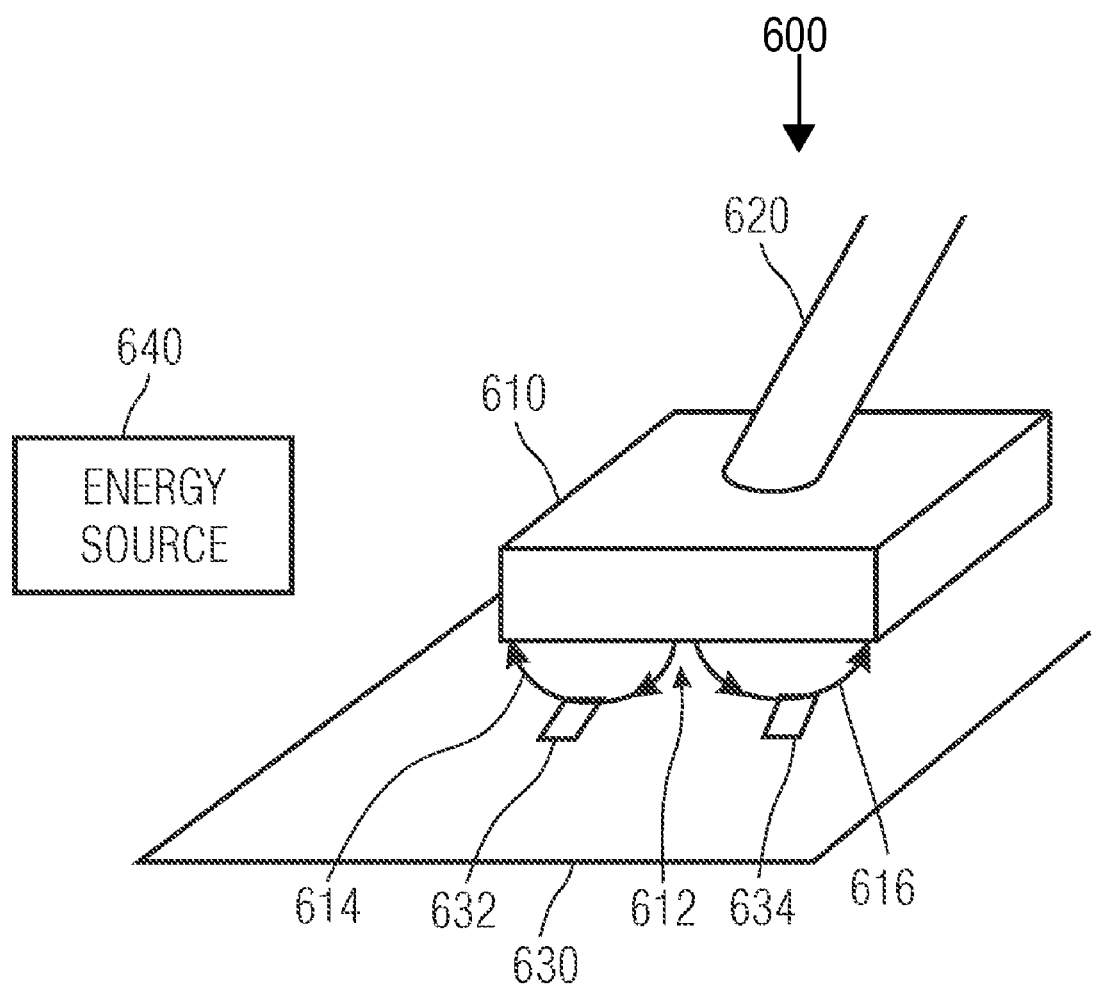
FIG. 6 is a schematic illustration of a write-in apparatus for producing magnetic field sensors, according to an embodiment.

FIG. 6 shows a schematic illustration of a write-in device for producing magnetic field sensors, according to the invention. The write-in apparatus according to FIG. 6 is designated with 600 in its entirety. The write-in device 600 includes a magnet 610, which is formed to generate a magnetic field in which magnetic field lines pass outwardly starting from a magnetic field center in various directions, or in which magnetic field lines pass from the outside toward a magnetic field center in various directions. The magnet 610 is exemplarily shown as rectangular parallelepiped-shaped, but the magnet 610 may also have any other suitable shape, for example be cylinder-shaped, that is.

The apparatus 600 further includes a positioning means 620, which is only hinted at in FIG. 6. The positioning means 620 is formed to position the magnet 610 with respect to a carrier 630, which carries a plurality of magnetic field sensor structures 632, 634, so that various ones of the magnetic field sensor structures 632, 634 are penetrated in various directions by magnetic field lines 614, 616, which originate from the magnetic field center 612 or which pass toward the magnetic field center 612. The apparatus 600 further includes an energy source 640, which is formed to supply the magnetic field sensor structures 632, 634 with energy, in order to enable magnetizations to be set permanently by the magnetic field generated by the magnet 610 in the magnetic field sensor structures 632, 634.

The arrangement 600 is based on the idea that a magnetic field in which magnetic field lines originate from a magnetization center or in which magnetic field lines pass toward the magnetization center is particularly well suited to produce or magnetize several magnetic field sensor structures at the same time or at least in a single magnetization operation (using a single magnetic field, that is).

A corresponding arrangement of the magnet 610 allowing for the concurrent magnetizing of several magnetic field sensor structures 632, 634 is produced by the positioning means 620.

Besides, the energy source 640 may take on completely different forms. Thus, the energy source 640 may, for example, be an electrical energy source formed to supply heating elements located in the proximity of the magnetic field sensor structures 632, 634 with electrical energy. The energy source 640 may, however, be a laser, for example, formed to illuminate the magnetic field sensor structures 632, 634 or a surrounding thereof with a laser beam, in order to bring about a heating of the magnetic field sensor structures 632, 634.

But the energy source 640 may also take on any other form, as long as it is ensured that the magnetic field sensor elements 632, 634 are placed in a state (for example, are heated sufficiently), so that permanent magnetizations can be set by the magnetic field generated by means of the magnet 610.

Figure 7A:
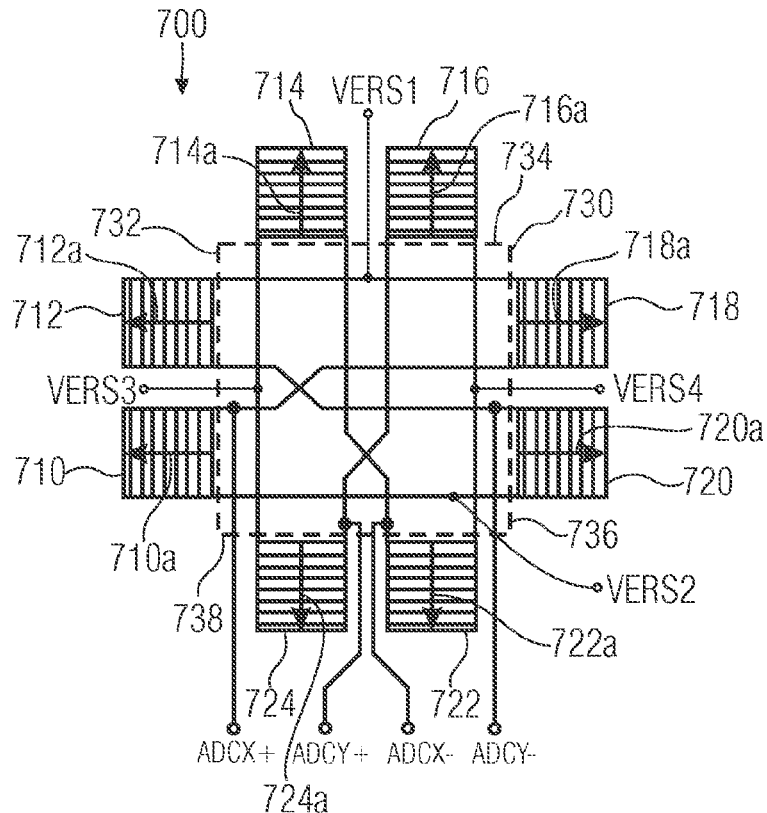
FIGS. 7A, 7B are schematic illustrations of sensors for sensing a magnetic field direction, according to embodiments.
Figure 7B:
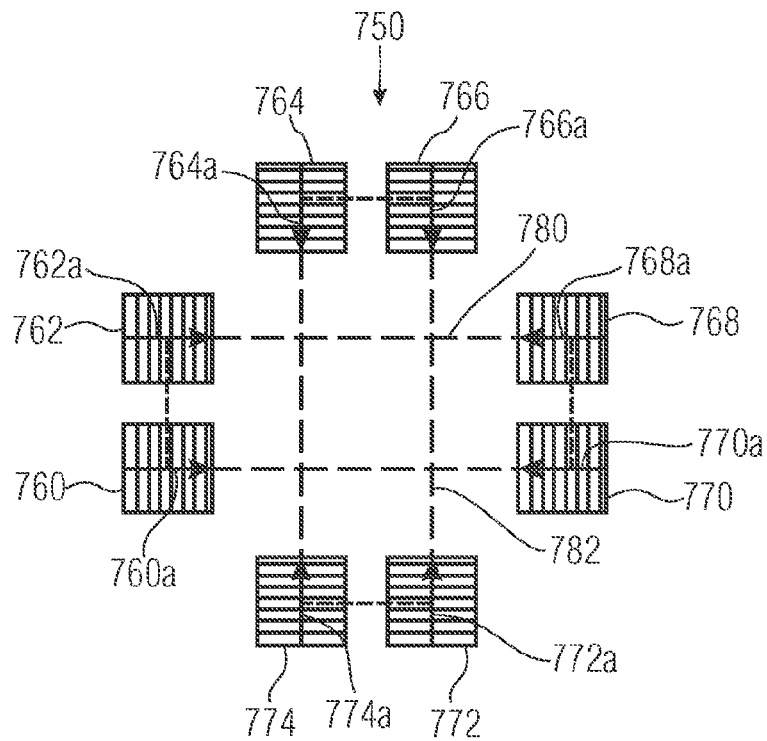

FIGS. 7A and 7B show top views onto arrangements of several magnetoresistive sensor elements connected in a bridge circuit. The arrangement according to FIG. 7A is designated with 700 in its entirety, and the arrangement according to FIG. 7B is designated with 750 in its entirety.

The arrangement 700 includes a total of eight magnetoresistive sensor elements 710, 712, 714, 716, 718, 720, 722, 724. In this respect, it is to be pointed out that the magnetoresistive sensor elements 710-724 are, for example, arranged on a common carrier, which is not shown here. The carrier may, for example, be a semiconductor material, but other carrier materials are also possible.

In the embodiment according to FIG. 7A, the magnetoresistive sensor elements 710, 724 are, for example, arranged around a (imaginary) rectangle or square 730. For the simplification of the explanation, the magnetoresistive sensor elements will be referred to as MRSE in the following in abbreviated manner. The first MRSE 710 and the second MRSE 712 are, for example, arranged along a first side 732 of the rectangle or square 730. The third MRSE 714 and the fourth MRSE 716 are arranged along a second side 734 of the rectangle or square 730. The fifth MRSE 718 and the sixth MRSE 720 are arranged along a third side 736 of the rectangle or square 730, and the seventh MRSE 722 and the eighth MRSE 724 are arranged along a fourth side 736 of the rectangle or square 730. In the embodiment described, no further MRSE is arranged inside the rectangle or square 730. Hence, there is no MRSE at a center of the rectangle or square 730, for example.

The MRSEs 710-724 each comprise main sensitivity directions. The main sensitivity directions of the respective MRSEs here are designated by arrows labeled 710a-724a. The main sensitivity directions 710a-724a of the magnetoresistive sensor elements here, for example, correspond to a direction in which the magnetoresistive sensor elements have been magnetized and the production. Hence, for example, the main sensitivity directions 710a-724a may correspond to the direction of the premagnetization or the opposite thereto. What is understood by main sensitivity direction of the magnetoresistive sensor elements is, by the way, the direction of a magnetic field causing, starting from a state in which no external magnetic field is applied, a maximum resistance change in the magnetoresistive sensor element.

In the arrangement 700 according to FIG. 7A, for example, the main sensitivity directions 710a-724a of all eight magnetoresistive sensor elements 710-724 face away from the interior of the rectangle or square 730. This indicates that all of the magnetoresistive sensor elements 710-724 were premagnetized with a magnetic field the field sides of which were either oriented away from the center of the rectangular or square 730, or the field lines of which were all oriented toward the center of the rectangular square 730. Thus, the production of the arrangement 700 according to FIG. 7A is possible using a single magnetic field, as it will still be described in the following.

Furthermore, it is to be pointed out that the magnetoresistive sensor elements 710-724 are connected into two full bridges, for example. The first MRSE 710, the second MRSE 712, the fifth MRSE 718 and the sixth MRSE 720, which are arranged along opposite sides 732, 736 of the rectangle or square 730, together form a first measuring bridge. Here, each bridge branch (a series connection of two magnetoresistive sensor elements between two supply potentials is understood by a bridge branch) includes two magnetoresistive sensor elements arranged along opposite sides 732, 736 of the rectangle or square 730. For example, a first bridge branch includes the second MRSE 712 and the sixth MRSE 720, wherein a tap ADCY− is provided between the second MRSE 712 and the sixth MRSE 720. A second bridge branch is formed by the first MRSE 710 and the fifth MRSE 718, wherein a tap ADCX+ is provided between the first MRSE 710 and the fifth MRSE 718.

Furthermore, the third MRSE 714, fourth MRSE 716, the seventh MRSE 722 and the eighth MRSE 724 are connected into a measuring bridge. A first bridge branch between a first supply potential and a second supply potential includes a series connection of the third MRSE 714 and the seventh MRSE 722. A second bridge branch of the second bridge includes a series connection consisting of the fourth MRSE 716 and the eighth MRSE 724. The second bridge includes a first tap ADCX−, which is (electrically) arranged between the third MRSE 714 and the seventh MRSE 722, and a second tap ADCY+.

Supply feeds (for example, first supply potentials, supply voltages or supply currents) for the bridges are, by the way, exemplarily designated with VERS1, VERS2, VERS3 and VERS4. Another supply of the bridges is possible, however.

Two MRSEs belonging to the second bridge thus are arranged along the second side 734 of the rectangular or square 730, and two further magnetoresistive sensor elements of the second bridge are further arranged along the fourth side 738 of the rectangle or square 730, wherein the fourth side 738 is opposite to the second side 734. Thus, the magnetoresistive sensor elements of the first bridge and the magnetoresistive sensor elements of the second bridge are arranged around a common central area, namely the interior of the rectangle or square 730. The central area, that is the interior of the rectangle 730, may thus serve as a magnetic field center, for example, in the production of the arrangement 700, from which magnetic field lines originate in various directions (for example, in all of the main sensitivity directions 710a-724a of the magnetoresistive sensor elements 710-724). Alternatively, in the production, the magnetic field lines may of course also all pass toward the magnetic field center, toward the interior of the rectangle or square 730, that is.

The above consideration of the magnetic field lines refers to a projection of the magnetic field lines, since the magnetic field lines of course fill the entire space. In the area of the interior of the rectangle 730 (or above or below, relative to the image plane of the rectangular 730), however, there may typically be a concentration of magnetic field lines. Details in this respect will still be explained in the following. Furthermore, it is to be pointed out that the location of all of the magnetoresistive sensor elements 710-724 may vary slightly. Some variation is already induced by process tolerances. Likewise, it is to be pointed out that a slight variation of the location of the magnetoresistive sensor elements does not lead to a serious change in the properties of the measuring bridges. Thus, for example, the individual magnetoresistive sensor elements 710-724 may be spaced from the rectangle 730. The admissible distance of the magnetoresistive sensor elements from the rectangle 730 amounts to a maximum of 20% of a side length of the rectangle in one embodiment. Furthermore, the magnetoresistive sensor element may be rotated slightly as opposed to the location shown. As such, a rotation angle of up to 30° does not substantially affect the functioning of the bridges, so that a rotation of up to 30° with respect to the location shown is admissible for each of the magnetoresistive sensor elements, for example. Furthermore, it is to be pointed out that, in one embodiment, the main sensitivity directions 710a to 724a are substantially perpendicular to the sides 732, 734, 736, 738 of the rectangle 730, along which the respective magnetoresistive sensor elements 710 to 724 are arranged. In other words, the main sensitivity directions 710a, 712a of the magnetoresistive sensor elements 710, 712, for example, substantially are perpendicular to the side 732 of the rectangle 730. But the main sensitivity directions may also vary clearly with respect to the location shown. As such, deviations of up to ±30° from the direction shown are well acceptable. In other words, the main sensitivity directions 710a to 724a may also pass obliquely (for example, inclined by an angle of up to ±30° with respect to a normal direction) to the sides 732, 734, 736, 738 of the rectangle 730.

FIG. 7B shows an arrangement 750, which substantially corresponds to the arrangement 700. Here, eight magnetoresistive sensor elements 760 to 774 are shown with associated main sensitivity directions 760a to 774a. The main sensitivity directions 760a to 774a point in opposite directions as compared with the main sensitivity directions 710a to 724a. In other words, the main sensitivity directions 760a to 774a, for example, all point to a central area around which the magnetoresistive sensor elements 760 to 774 are arranged. Besides, it is to be pointed out that the connection of the magnetoresistive sensor elements with measuring bridges is not shown in the arrangement 750. The connection may, however, be exactly like in the arrangement 700, for example.

Besides, it is to be pointed out that the arrangements of the magnetoresistive sensor elements 760 to 774 (just like the arrangements of the magnetoresistive sensor elements 710 to 724) may also be described as follows:

The first magnetoresistive sensor element 760, the second MRSE 762, the fifth MRSE 768 and the sixth MRSE 770 are arranged at the corners of a (imaginary) first rectangle 780. The third MRSE 764, the fourth MRSE 766, the seventh MRSE 772 and the eighth MRSE 774 further are arranged at the four corners of a second (imaginary) rectangle 782. The two rectangles 780, 782 here are shown by dashed lines. Furthermore, the first imaginary rectangle 780 and the second imaginary rectangle 782 intersect, so that the two rectangles 780, 782 form a cross. The intersection area of the two rectangles thus forms a center in which, for example, in the production of the arrangement 750, there may be a concentration of magnetic fields.

Altogether, it may thus be noted that all of the magnetoresistive sensor elements 760 to 774 are arranged around the center or the central area (for example, around the intersection area of the rectangles 780, 782, for example), wherein the central area is free from magnetoresistive sensor elements. The central area may thus serve to allow for generation of a magnetic field that is substantially radially symmetrical or goes out in various directions as seen from the central area, in the production of the magnetoresistive sensor elements.

In the following, on the basis of FIGS. 8A and 8B, it will be described how the arrangements 700, 750 according to FIGS. 7A and 7B may be produced. To this end, FIG. 8A shows a cross-section through the center arrangement in the presence of a magnet for adjusting permanent magnetizations. Furthermore, FIG. 8B shows a cross-sectional illustration through the magnetic configuration used or present in the arrangement according to FIG. 8A, wherein the magnetic field is illustrated by equipotential lines.

The arrangement of FIG. 8A is designated with 800 in its entirety. The arrangement 800 includes, for example, eight magnetoresistive sensor elements 810 to 824, for example, substantially corresponding to the magnetoresistive sensor elements 710 to 724 or 760 to 774. The magnetoresistive sensor elements, which may, for example, be GMR sensor elements (using the gigantic magnetoresistive effect) or TMR sensor elements (using the tunnel magnetoresistive effect), also are designated with "G". The arrangement 800 further includes a magnet arrangement. The magnet arrangement on the one hand includes a central pole 830 and four peripheral poles 840, 842, 844, 846 on the other hand. In this respect, it is to be pointed out that the magnetoresistive sensor elements 810 to 824 and the magnetic arrangement consisting of the central pole and the peripheral poles 840 to 846 do not necessarily lie in the same plane. Thus, for example, the magnetic arrangement may be above or below a carrier on which the magnetoresistive sensor elements 810 to 824 are arranged. The illustration of FIG. 8A thus is to be understood as a schematic top view illustration, wherein an actual arrangement of the individual elements with respect to each other may vary in terms of location perpendicular to the drawing plane.

Besides, one possible location is shown in a cross-sectional illustration 850. The magnetoresistive sensor elements 810, 820 are arranged on a carrier 852. For example, the central pole 830 is arranged above the carrier 852, just like the peripheral pole 846. Magnetic field lines 854, which pass between the central pole 830 and the peripheral pole 846, here, for example, penetrate the magnetoresistive sensor elements 810, 820.

In the following, the relative arrangement of the magnetoresistive sensor elements 810 to 824 will be explained in greater detail with respect to the magnet arrangement 830, 840 to 846. In the embodiment shown, the central pole 830 comprises an at least substantially rectangular or square cross-section. In a top view, there are four sides 832, 834, 836, 838. The peripheral poles 840 to 846 by the way, for example, have a rectangular cross-section, too. The first peripheral pole 840, for example, lies opposite to the first side 832 in the top view according to FIG. 8A. Likewise, the second peripheral pole 842, for example, lies opposite to the second side 834. The third peripheral pole 844 lies opposite to the third side 836, and the fourth peripheral pole 846 lies opposite to the fourth side 838. In the top view, for example, the first MRSE 810 and the second MRSE 812 lie between the first side 832 with the first peripheral pole 840. Furthermore, the third MRSE 814 and the fourth MRSE 816 lie between the second side 834 and the second peripheral pole 842. The fifth MRSE 818 and the sixth MRSE 820 lie between the third side 836 and the third peripheral pole 844. The seventh MRSE 822 and the eighth MRSE 824 lie between the fourth side 838 and the fourth peripheral pole 846. Thus, for example, the magnetic field lines passing from the central pole 830 to the first peripheral pole 840 penetrate the first MRSE 810 and the second MRSE 812, as this is also shown in the cross-sectional illustration 850. The magnetic field lines penetrating the first MRSE 810 and the second MRSE 812, for example, pass in a first direction in a top view. The magnetic field lines passing from the central pole to the second peripheral pole 842 penetrate the third MRSE 814 and the fourth MRSE 816 and pass in substantially a second direction in the top view. The second direction may for example be approximately orthogonal to the first direction (or an angle between the first direction and the second direction may range from 75° to 105°). Magnetic field lines passing from the central pole 830 toward the third peripheral pole 844, for example, penetrate the fifth MRSE 818 and the sixth MRSE 820, wherein the magnetic field lines mentioned pass in a third direction, which, for example, is approximately opposite to the first direction, in a top view.

Magnetic field lines passing from the central pole 830 to the fourth peripheral pole 846, for example, further penetrate the seventh MRSE 822 and the eighth MRSE 824, wherein the magnetic field lines mentioned pass in a fourth direction, which for example is approximately opposite to the second direction, in a top view.

It is to be pointed out that the arrangement 800 according to FIG. 8A is of course only given during a production step of a magnetic field sensor. In the corresponding production step, the magnetic field described is generated by the magnet arrangement in the, for example, still unfinished magnetoresistive sensor elements 810 to 824. Through appropriate treatment (e.g., by heating the magnetoresistive sensor elements 810 to 824), it is achieved here that the magnetic field generated by the magnet arrangement leads to a premagnetization or to the setting of a permanent magnetic field in the magnetoresistive sensor elements 810 to 824.

Besides, the arrangement 800 may be varied substantially. Thus, it is sufficient, for example, if altogether only three or four magnetoresistive sensor elements are present. In one embodiment, for example, only the first magnetoresistive sensor element 810, the third magnetoresistive sensor element 814, and the fourth magnetoresistive sensor element 818 are present. Thus, for example, three magnetoresistive sensor elements 810, 814, 818 are premagnetized in different directions, or permanent magnetic fields are written into the magnetoresistive sensor elements.

In a further embodiment, the arrangement includes four magnetoresistive sensor elements, which together form a bridge, for example the four magnetoresistive sensor elements 810, 812, 818, 820. In other words, it is not necessary to use a total of eight magnetoresistive sensor elements, but it is also sufficient to use only four magnetoresistive sensor elements, which for example (but not necessarily) are part of a measuring bridge.

In a further embodiment, it is sufficient for the arrangement to include four magnetoresistive sensor elements, which are all premagnetized in different directions. For example, it is sufficient if only the magnetoresistive sensor elements 810, 814, 818, 822 are present.

Furthermore, it is to be pointed out that a cross-sectional shape of the central pole 830 may differ from the illustrated rectangle shape or square shape. For example, the central pole 830 may have the shape of a trapezoid or a parallelogram in terms of its cross-section. Individual corners may also well be rounded in the cross-section. Furthermore, the cross-sections of the peripheral poles 840 to 846 may also be changed as opposed to the shown rectangle shape, as long as several peripheral pole areas lie opposite to individual sides of the central pole 830, for example.

Besides, it is not necessary for the central pole 830 to have four sides 832 to 838. For example, it may be sufficient for the central pole to have three sides and, for example, have an approximately triangular cross-section. It also is not necessary to have exactly four peripheral poles. Rather, it is sufficient to have two or three peripheral pole areas or peripheral poles. Besides, peripheral pole areas may also be connected to each other in the cross-section.

Besides, it is also possible for the central pole to have more than four sides, wherein correspondingly more than four peripheral poles or pole areas are present.

In the following, the magnetic field developing in the arrangement according to FIG. 8A will still be explained on the basis of FIG. 8B. FIG. 8B shows the central pole 830 as well as the peripheral poles 840, 842, 844, 846 in a cross-sectional illustration. The magnetic field forming between the central pole 830 and the peripheral poles 840 to 846 is described based on an FIM (finite element method) simulation of the magnetic configuration or the magnetic setup by equipotential lines 870. Besides, magnetic field lines pass perpendicularly to the equipotential lines 870, as generally known.

Figure 9A:
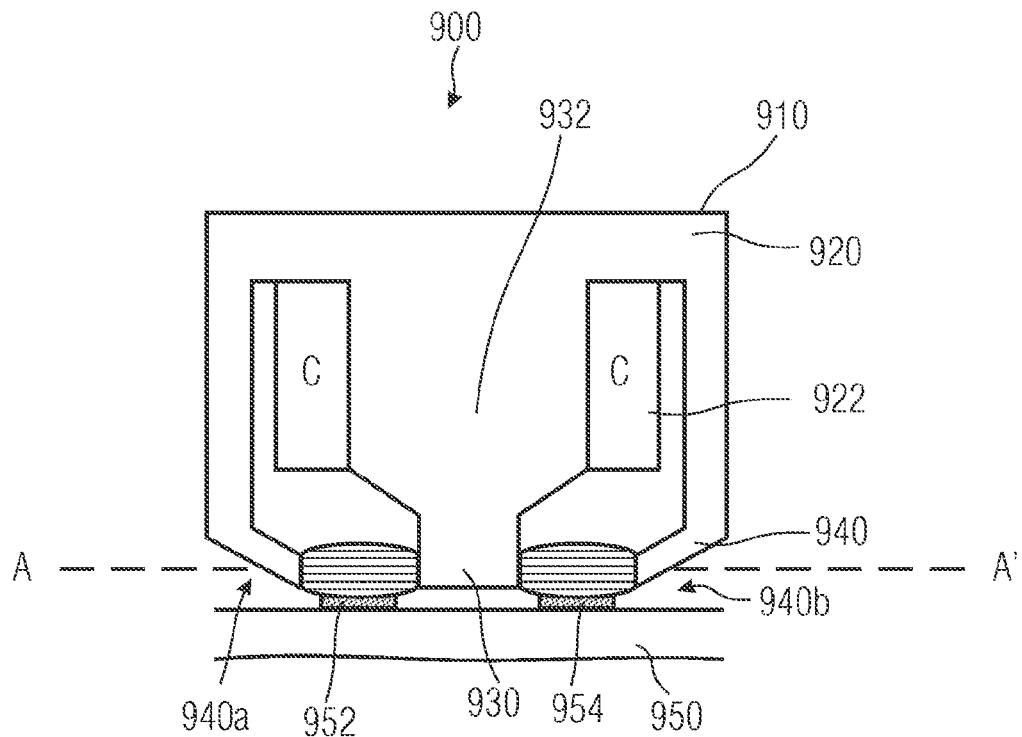
FIG. 9A is a schematic top view illustration of an arrangement for writing a magnetic field into magnetic field sensor structures, according to an embodiment.

FIG. 9A shows a cross-sectional illustration of a further arrangement for setting a premagnetization in a plurality of magnetoresistive sensors. The arrangement according to FIG.

9A is designated with 900 in its entirety. The arrangement 900 includes, for example, a radially symmetrical magnet 910. The magnet 910, for example, includes a magnetically conductive material, a material of high magnetic permeability, that is. The magnet 910 may be a permanent magnet. But the magnet 910, in another embodiment, includes a magnetic field conductor structure 920 as well as an electric coil 922, which is arranged on the magnetic field conductor structure 920, to impress a magnetic field in the magnetic field conductor structure 920.

The magnetic field conductor structure 920, for example, includes a central pole 930, which, for example, transitions to a coil carrier area 932. The electric coil 922 is arranged around the coil carrier area 932, for example. Furthermore, the magnetic field conductor structure 920 includes an outer pole area 940. The outer pole area 940 here surrounds the central pole 930, for example, in a radially symmetrical manner. The magnet 910 is, for example, designed to conduct the magnetic field generated by the coil 922, so that a magnetic field concentration arises between the central pole 930 and the external pole area or peripheral pole area 940. In other words, the magnetic field conductor structure 920, for example, is designed so that a clearance area between the central pole 930 and the external pole area 940 acts as an air gap in a magnetic circle, in which a field concentration arises. In other words, the field occurring in the clearance around the magnetic conductor structure is, apart from stray fields, concentrated in the area between the central pole 930 and the external pole area 940.

The central pole may, for example, be substantially cylinder-shaped. The central pole may, however, also have a rectangular cross-section. The external pole area 940, for example, completely surrounds the central pole. But the outer pole area 940 may also be divided into individual outer poles, as this was for example described on the basis of the sectional top views according to FIGS. 8A and 8B.

Furthermore, it is to be pointed out that in one embodiment the arrangement 900 or the magnetic field conductor structure 920 may be substantially rotation-symmetrical. Furthermore, it is to be pointed out that in a premagnetization of magnetoresistive sensor elements or of magnetic field sensor structures, which become magnetoresistive sensor elements by the application of the premagnetization, the magnet 910 may be approximated to a plurality of magnetoresistive sensor elements in the manner shown. In this respect, FIG. 9A shows a carrier 950 on which, for example, at least two magnetoresistive sensor elements (or magnetic field sensor structures) 952, 954 are arranged. The magnet 910 is approximated to the carrier 950 or to the MRSE 952, 954 in the production of the magnetoresistive sensor elements 952, 954, so that the first magnetoresistive sensor element lies in a surrounding of a gap between the central pole 930 and a first area 940a of the external pole area 940. Furthermore, in suitable positioning of the magnet, the second magnetoresistive sensor element 954 or the second magnetic field sensor structure 954 lies in a surrounding of a gap between the central pole 930 and a second area 940b of the external pole area. The magnetic field center lies adjacent to an area between the magnetoresistive sensor elements 952, 954. In other words, an imaginary extension of the central pole 930 passes between the magnetoresistive sensor elements 952, 954, whereas the magnetoresistive sensor elements 952, 954 are arranged adjacent to the gap between the central pole and the external pole area 940.

Thus, magnetic field lines passing between the central pole 930 and the outer pole area 940a penetrate the first magnetoresistive sensor element 952 in a first direction. Magnetic field lines passing between the central pole 930 and the outer pole area 940b penetrate also the second magnetoresistive sensor element 954 in a second direction. The first direction here differs from the second direction. For example, the first direction is (at least approximately) opposite to the second direction.

Figure 9B:
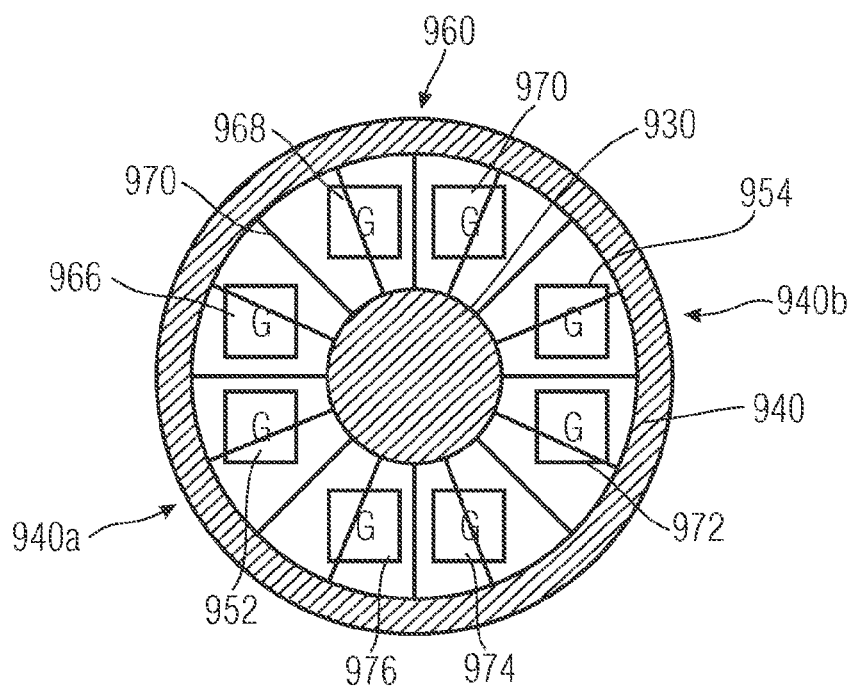
FIG. 9B is a cross-sectional illustration of the arrangement according to FIG. 9A.

FIG. 9B shows a top view onto an arrangement for premagnetizing several magnetoresistive sensor elements with a single magnetic field. The arrangement according to FIG. 9B is designated with 960 in its entirety. In this respect, it is to be pointed out that the top view according to FIG. 9B, for example, may be a cross-sectional illustration describing a cross-section through the arrangement 900 according to FIG. 9A along the line AA' perpendicular to the drawing plane.

The arrangement 960 for example includes a total of eight magnetoresistive sensor elements 952, 954, 966, 968, 970, 972, 974, 976. The MRSEs 952, 966, 954, 972, for example, are connected into a first bridge, as this was described above. The MRSEs 968, 970, 974, 976, for example, are connected into a second bridge, as described. Due to the substantially radially symmetrical cross-sectional shape of the central pole 930 as well as the outer pole area 940, for example, the adjacent magnetoresistive sensor elements 952, 966 have different directions of the magnetic premagnetization (of the impressed permanent magnetic field, that is), as well as, resulting therefrom, different main sensitivity directions. Similar things also apply for the premagnetization directions or the main sensitivity directions of the magnetoresistive sensor elements 954, 972. For example, an angle between the premagnetization directions or main sensitivity directions of the magnetoresistive sensor elements 954, 966 ranges from 0 to 45°, or from 10° to 45° in another embodiment. Similar things apply for an angle between the main sensitivity directions of the magnetoresistive sensor elements 972 and 954. Besides, it is to be pointed out that the MRSEs 952, 966, 954, 972, in this embodiment, are arranged substantially point-symmetrically with respect to a symmetry center, which for example is defined by a magnetic axis of the magnet 910.

The statements made with regard to the magnetoresistive sensor elements 952, 966, 954, 972 also roughly apply for the magnetoresistive sensor elements 968, 970, 974, 976 of the second bridge. For example, the magnetoresistive sensor elements of the second bridge, apart from a rotation by 90° about an axis perpendicular to the carrier plane or drawing plane, may be arranged exactly like the magnetoresistive sensor elements of the first bridge.

Besides, it is to be pointed out that the magnetic field directions of the magnetic field between the central pole 930 and the outer pole area 940 are described by radial lines 970. Besides, it is to be pointed out that after a production, i.e., for example, after a removal of the magnets 910, the premagnetization directions or main sensitivity directions of the magnetoresistive sensor elements thus arising substantially correspond to the local magnetic field directions of the magnetic field generated by the magnet 910 at the location of the magnetoresistive sensor elements.

Figure 10B:
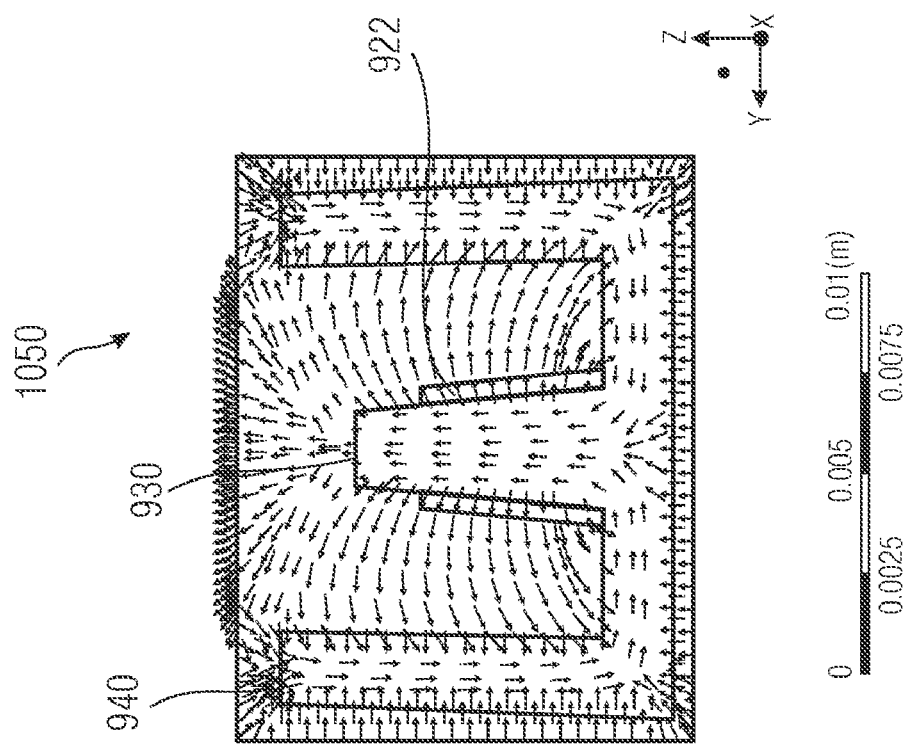
Figure 10A:
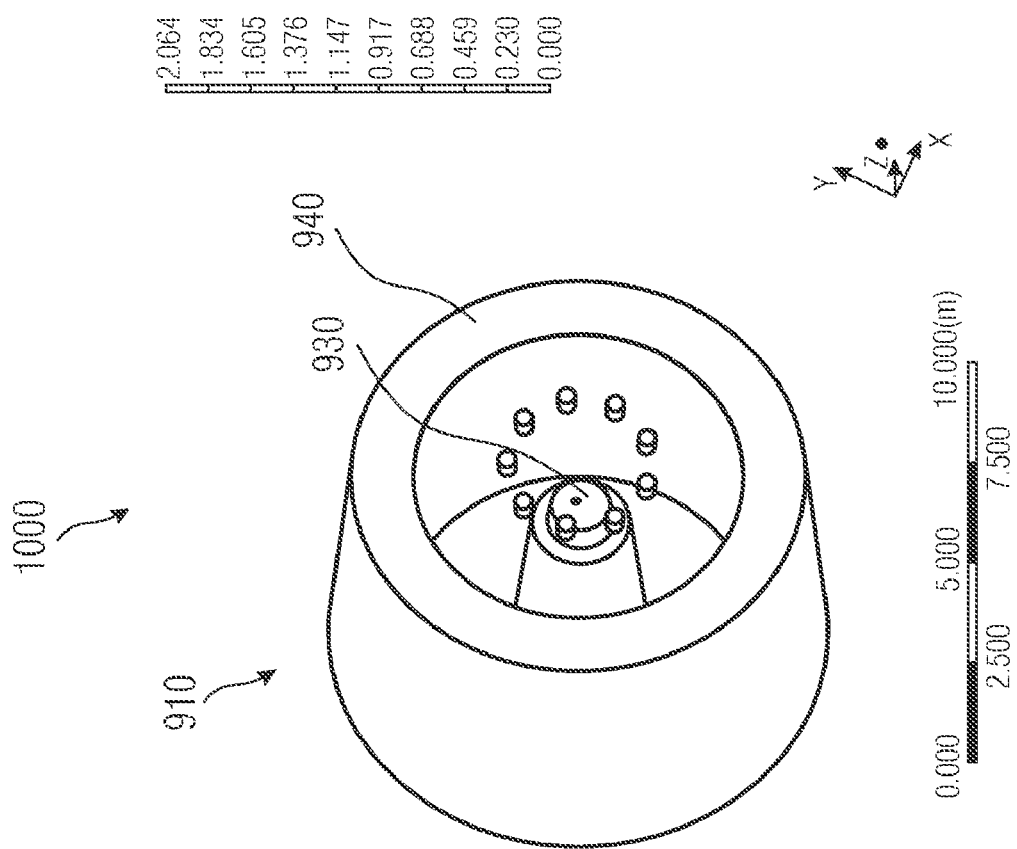
FIG. 10A is a three-dimensional illustration of a magnet for writing a magnetic field into a magnetic field sensor structure, according to an embodiment.

FIG. 10A shows a three-dimensional illustration of an exemplary magnet for premagnetization of several magnetoresistive sensor elements, wherein the premagnetization of the several magnetoresistive sensor elements may, for example, (but not necessarily) take place concurrently. The three-dimensional illustration of FIG. 10A is designated with 1000 in its entirety. The three-dimensional illustration 1000 shows a radially symmetrical magnet, as it was already described on the basis of FIGS. 9A and 9B. Hence, the same reference numerals as in FIGS. 9A and 9B are used in FIG. 10A, and reference is made to the above explanations.

FIG. 10B shows an illustration of a cross-section through the magnet 910 according to FIG. 10A. The cross-sectional illustration according to FIG. 10B is designated with 1050 in its entirety. In the cross-sectional illustration 1050, for example, local magnetic field directions are characterized by arrows based on a magnetic field simulation.

In summary, it may thus be stated that, by an appropriate bridge arrangement, it may be achieved that magnetoresistive sensor elements or GMR elements may be written in here in a single process step. With further easy-to-realize measures, performance of such a sensor may be enhanced further.

According to an embodiment, it is possible to arrange a GMR bridge magnetization (i.e., for example, a magnet with the aid of which the GMR sensor elements are premagnetized) so that, for example, a radial magnetic field is sufficient for the write-in process. Hence, in one embodiment, only the magnetic field needs to be applied and the corresponding temperature adjusted, in order to program (or premagnetize) the GMR resistors (or the magnetoresistive sensor elements). In one embodiment, this only necessitates a single process step, wherein this may also be parallelized even with many other chips. Besides, the concept mentioned also is transferable to other arrangements in which no bridge circuits, but discrete GMR resistors are used, as will still be explained in greater detail in the following.

On the basis of FIG. 7A, radial or substantially radial write-in directions of GMR resistors configured in bridge circuits were described. On the basis of FIG. 7B, the same arrangement as in FIG. 7A was shown, only with opposite magnetic polarity.

As already explained above, a magnetic write-in apparatus may, for example, be a single current-carrying coil or a permanent magnet with special magnetic guiding plates. But other arrangements may also be used, which, for example, include several current-carrying coils and/or several permanent magnets. Besides, on the basis of FIG. 8A, a cross-section or a plan view (from above) of a magnetic write-in arrangement was described. GMR sensors or GMR sensor elements are designated with G in the description according to FIG. 8A, a central pole or middle pole 830 is designated with C, and peripheral poles 840, 842, 844, 846 are designated with P.

Guiding plates or magnetic guiding plates (which, for example, guide the magnetic field and further form the poles of the magnet) may be optimized for optimum magnetization in a further area. An optimization goal may here, for example, be by the homogeneity of the magnetic field in the GMR resistors.

Furthermore, for example, FIGS. 9A and 9B show an apparatus allowing for further improvement of the properties of a magnetic field sensor. FIG. 9A here, for example, shows a cross-section through a magnetic write-in arrangement (for example, from the front). One or more coils 922 here are designated with C (coils).

So as to achieve, for example, improvement of the performance with respect to hysteresis and anisotropy, for example, a write-in angle (i.e., for example, an angle between longitudinal sides of GMR meanders and a magnetic field applied for premagnetization of the magnetoresistive sensor elements) may be non-orthogonal to the GMR meanders. Through slight modification of a write-in configuration or a write-in arrangement, this demand may for example be realized easily. In other words, the magnetoresistive sensor elements may, for example, be aligned so that a direction of the write-in magnetic field is inclined with respect to an advantageous direction of meanders in the magnetoresistive sensor. What is understood here by the advantageous direction is the direction of the meanders along which the long tracks of the meanders run.

For example, the magnetoresistive sensor elements may be arranged so that the advantageous directions of the meanders, together with a radial direction (starting from a magnetization center or from an intersection area, as defined above), enclose an angle ranging from 5° to 85°. This arrangement may generally be used for all magnetic field sensors described within the scope of the present description.

Besides, on the basis of FIG. 9B, a radial (or radially symmetrical) write-in apparatus of GMR angle measuring bridges was shown. A radial shape of the write-in magnet, for example, satisfies all requirements regarding quick write-in procedure and as small as possible GMR sensor errors. Even a triangular distortion of trigonometric components (such as shown on the basis of FIG. 23) is distributed to an entire half-wave and thus significantly reduced by the not quite exactly equally aligned GMR directions. Hence, a computational compensation of these third harmonic errors becomes significantly simpler than in conventional arrangements and may even be completely superfluous.

In the following, further embodiments of the present invention will be described in greater detail, which allows for simple realization of an angle sensor. So as to facilitate understanding of the concept of the described embodiment, the concept proposed will be explained on the basis of a mathematical model in the following.

Here, at first a magnetic field generated by an ideal, dimensionless coil the aperture of which is centered in the origin of a polar coordinate system is assumed. The generated field has a completely circular symmetry, axial with respect to the origin of the coordinate system, due to the rotary properties of the magnetic field. A corresponding coil is, for example, shown in FIG. 10A, and the resulting magnetic field is shown in FIG. 10B. In other words, FIGS. 10A and 10B describe a magnetic field source, as it is, for example, assumed exemplarily within the scope of the following explanations.

In the case of GMR sensor elements a z-component of the field does not have any influence on the angle response. What is understood here by a small z-component, for example, is a magnetic field component perpendicular to the surface of the carrier on which the magnetoresistive sensor elements are arranged. Due to the above-described fact, the z-component mentioned will be neglected in the following, and the resulting in-the-plane vector will be designated as $\overline{B}$ each.

Figure 11:
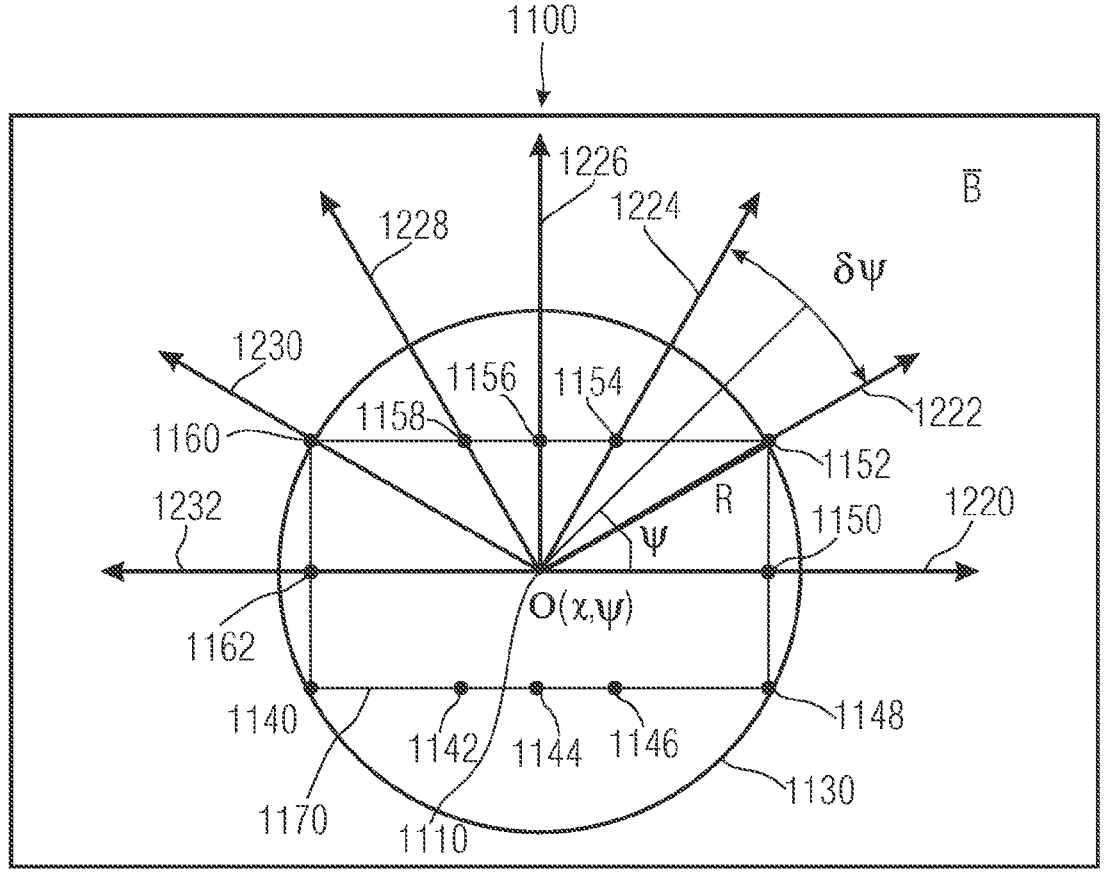
FIG. 11 is a schematic illustration of magnetic flux lines.

What will be described in the following are the flux lines resulting on the basis of FIG. 11. To this end, FIG. 11 shows a sketch or an outline of magnetic flux lines $\overline{B}$. The graphical illustration of FIG. 11 is designated with 1100 in its entirety. The graphical illustration 1100 shows a center 1110, from which several beams 1220, 1222, 1224, 1226, 1228, 1230, 1232 originate. Furthermore, there is shown a circular line 1130 having its center in the origin 1110. Several points or magnetoresistive sensor elements 1140, 1142, 1144, 1146, 1148, 1150, 1152, 1154, 1156, 1158, 1160, 1162 are arranged along the sides of a rectangle 1170 or at corners of the rectangle 1170.

In the following, C designates a circumference or a (surrounding) circle centered in the point or the origin O (x, Ψ). Furthermore, a beam will be designated with R in the following. A vector $\overline{B}$ is orthogonal to each selected point along C. For angle sensors based on a GMR technology, the magnitude $|\overline{B}|$ or the amount of $\overline{B}$ does not contribute to the response of the sensor element when the sensor element is located at a suitable working point or is brought to a suitable working point, or when the sensor element is biased correctly. Details in this respect will be explained in more detail in the following. Based on this assumption, only the phase or the angle of $\overline{B}$ is relevant for the analysis. In the following, $\Psi$ designates the phase or the angle of $\overline{B}$ (e.g. with respect to a reference direction).

Figure 12:
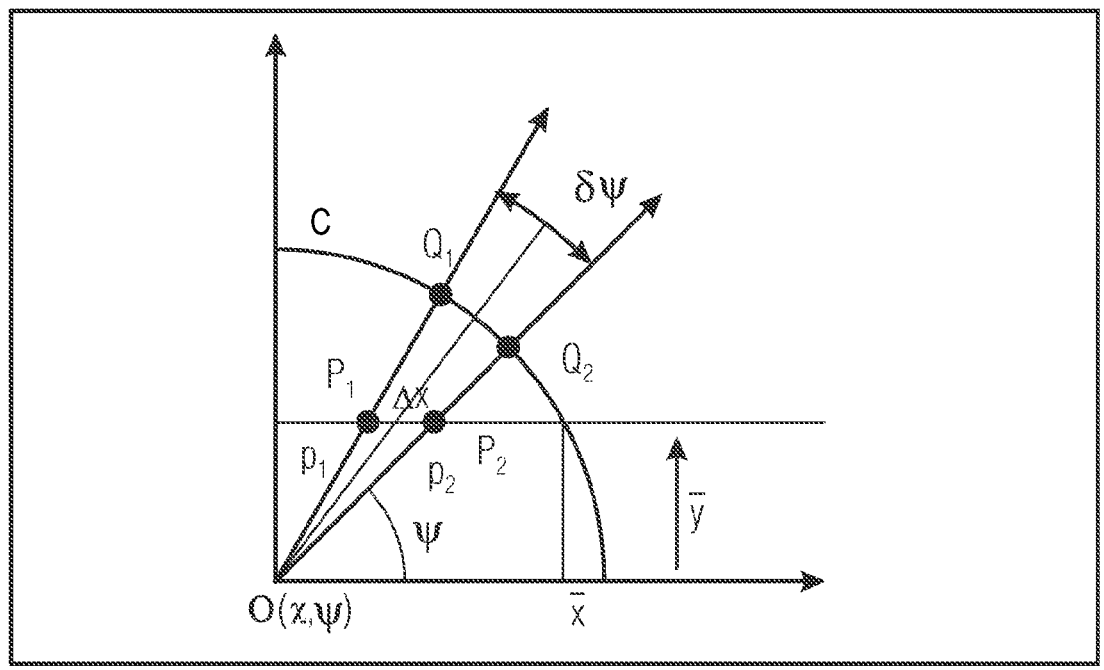
FIG. 12 is a schematic illustration of a mapping concept.

FIG. 12 shows a graphical illustration of a mapping concept. As shown in FIG. 12, the circumference or the (surrounding) circle C may be discretized by a series of fixed angle steps equal to $\delta\Psi$. In the following, a concept or an approach based on a manifold ("manifold approach") will be described.

As such, for example, two points $Q_1$ and $Q_2$ on C may be selected, so that the following applies for their coordinates each:

$$Q1\left(R, \psi + \frac{\delta\psi}{2}\right)$$ (Equation 1)

$$Q2\left(R, \psi - \frac{\delta\psi}{2}\right).$$

Along the beams connecting $Q_1$ and $Q_2$ to O, the points $P_1$ and $P_2$ lying at a target default or at a default $\overline{y}$ value are flown through by a magnetic field normal to C. With reference to FIG. 12, a relation between $\Delta x$ and $\delta_\Psi$ adheres to the following equation:

$$\Delta x = \rho_2 \cos\left(\Psi - \frac{\delta\Psi}{2}\right) - \rho_1 \cos\left(\Psi + \frac{\delta\Psi}{2}\right) \Rightarrow$$ (Equation 2)

$$\Delta x = \overline{y}\left(\frac{1}{\tan\left(\Psi - \frac{\delta\Psi}{2}\right)} - \frac{1}{\tan\left(\psi + \frac{\delta\Psi}{2}\right)}\right) = \Delta x(\Psi)_{\overline{y}, \delta\psi}.$$

Hence, $\Delta x$ may be regarded as a function of $\Psi$ with the parameter $\delta_\Psi$.

Hence, it follows that $\Delta x$ maps a sector of C to a Cartesian equivalent projection (manifold).

If $\overline{y}$ is fixed or default, the spanned sector belongs to angles $\Psi$ in the range of $$\Psi \in \left[-\operatorname{atan}\left(\frac{\overline{y}}{\overline{x}}\right), \operatorname{atan}\left(\frac{\overline{y}}{\overline{x}}\right)\right].$$ (Equation 3)

Since equation 2 previously described represents a non-linear mapping, a minimum of the mapping is of interest. The result (in the calculation of the minimum) will prove very useful in an implementation phase. Hence, for example, the following equation may be solved as follows:

$$\frac{\partial}{\partial\Psi}\Delta x = 0 \Rightarrow \Delta x_{1,2} = \frac{\delta\Psi}{2} \pm \operatorname{atan}\left(\frac{\pm 1 + \sqrt{1 + \tan^2(\delta\Psi)}}{\tan(\delta\Psi)}\right).$$ (Equation 4)

As expected, for comparably small values of $\delta_\Psi$, a minimum of $\Delta x$ occurs at $\Psi = \pm K\pi/2$, wherein K is a natural number.

In other words, in one embodiment, a minimum value for $\Delta x$, which is designated with $\Delta x_{min}$ and typically is imposed by technological limitations, is taken into account for a real implementation phase.

In the following, a GMR angle response will be explained in greater detail. In this respect, it is to be pointed out that in the previous section it was described that a special arrangement of point-shaped elements can be used to map a circumference to a discrete linear manifold. In the present section, the principles of a sensing mechanism by which a GMR angle response may be converted into a measurable quantity will be described.

As existing experimental results demonstrate, a GMR spin-valve used in deep magnetic saturation shows a behavior in accordance with the following equation:

$$f(\Psi) = \frac{\Delta R}{R} = \frac{1 - \cos(\Psi)}{2}.$$ (Equation 5)

Here, $\Psi$ is an angle between the external magnetic field and an internal reference layer of the spin-valve.

In order to calculate a resolution needed by a sensing mechanism, one may at first understand how a finite phase change (or angle change) $\delta_\Psi$ influences the GMR response. To this end, at first the derivative of the equation 5 is calculated:

$$f'(\Psi) = \frac{\partial}{\partial\Psi}f(\Psi) = \frac{1}{2}\sin(\Psi).$$ (Equation 6)

For a given phase change (or angle change) $\delta_\Psi$ by $\Psi_i$, the corresponding change $\delta_\Psi$ of the function f is:

$$\Delta f(\Psi_i) \cong \frac{\partial}{\partial\Psi}f(\Psi)\bigg|_{\Psi_1} \cdot \delta\Psi = \frac{\delta\Psi}{2}\sin(\Psi_i).$$ (Equation 7)

Equation 7 states that, for a given angle $\delta_\Psi$ around the angle $\Psi_i$, the change of the GMR response is proportional to sin ($\Psi_i$), wherein the scaling factor=$\delta_\Psi/2$. By multiplication of the constituting law according to equation 5 by the factor $(\delta_\Psi/2)^{-1}$ (amplification), the sensitivity of the GMR or the GMR sensor element changes in a pure sine (sin). Besides, higher amplification factors may bring along an advantage for later signal processing.

Figure 13:
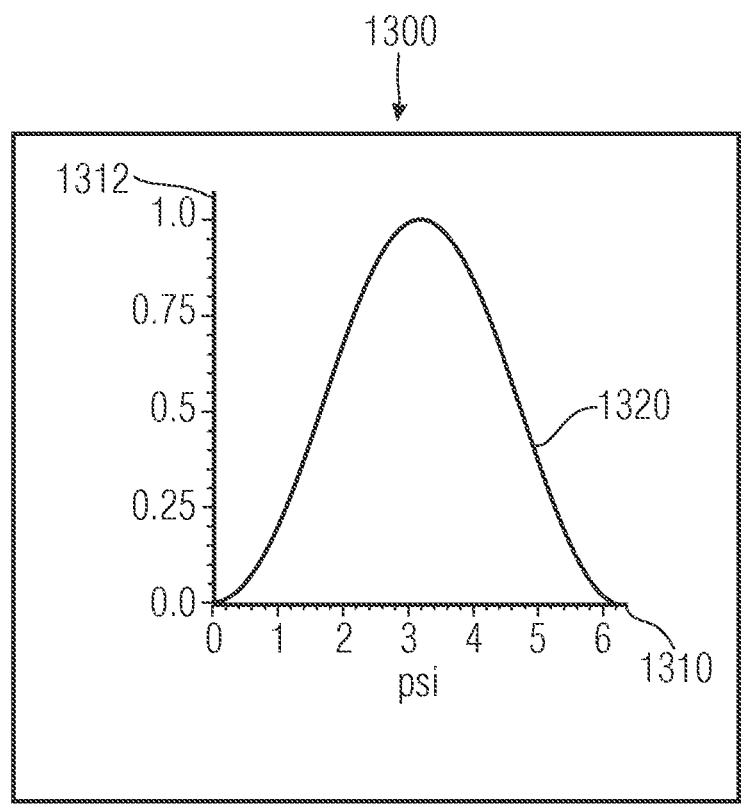
FIG. 13 is a graphical illustration of a GMR angle response.

For the illustration of the above connections, FIG. 13 shows a graphical illustration of a dependence of the function f on an angle $\Psi$. The graphical illustration of FIG. 13 is designated with 1300 in its entirety. On an abscissa 1310, here the angle $\Psi$ is plotted. On an ordinate 1312, the value of the function f is plotted, and a curve 1320 describes the connection between $\Psi$ and $f(\Psi)$.

Figure 14:
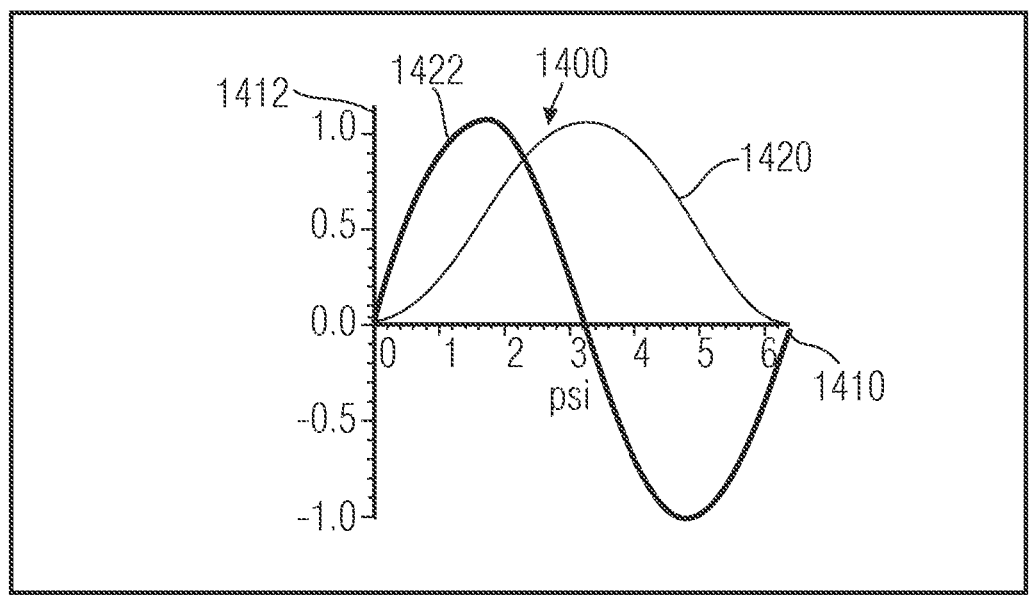
FIG. 14 is a schematic illustration of a GMR angle response as well as a GMR angle sensitivity.

Furthermore, FIG. 14 shows a graphical illustration of a connection between the angle $\Psi$ and the value $\Delta f$. The graphical illustration of FIG. 14 is designated with 1400 in its entirety. On an abscissa 1410, the angle $\Psi$ is plotted, and on an ordinate 1412, the value of f or of $\Delta f$ is plotted. A first curve 1420 shows f as a function of $\Psi$, and a second curve 1422 describes $\Delta f$ as a function of $\Psi$.

The above analysis gives an indication of the capability, resolution and noise suppression or noise rejection of the sensing block. For example, the latter should be capable of resolving differences $\Delta = \sin(\Psi_{i-1}) - \sin(\Psi_i)$ with sufficient accuracy to ensure that no overlaps occur.

The parameter $\delta_\Psi$ may be fixed by design or by application. Here, $\delta_\Psi$ is equal to a discretization step and further, for example, equal to a sensor resolution. For example, $\delta_\Psi$ may be equal to 0.1°, or, for example, range from 0.01° to 5°.

Thus, the only unknown is the sine function or sin function, for example, which may be converted by an analog-to-digital converter (ADC), for example. An analog-digital converter resolution is chosen, in one embodiment, to resolve minimum changes of f. As previously shown, it is expected that f varies least around $\Psi_i=K\pi$, wherein K is a natural number. In formulae:

$$f(\Psi)=0 \Rightarrow \Psi=K\pi \text{ wherein } K \in N. \quad \text{(Equation 8)}$$

In one embodiment, a high resolution of the analog-digital converter (ADC) is needed around $K\pi$, to discriminate a step of $\delta_\Psi/2 \sin(K\pi+\delta_\Psi)$. In the following section, however, it will be described that the system also works very well without the use an analog-to-digital converter (ADC).

In the following, details or considerations with respect to a sensing mechanism will be described.

According to the results of the last section, in some embodiments a resolution needed for a sensing procedure is comparably high. This is mainly due to the fact that a very small variation of f occurs at angles of $K\pi$. The mapping approach described solves the problem of the resolution in an elegant manner, as will be shown in the following explanation.

For a given angle $\Psi_i$, in many cases (in some embodiments even mostly) there is an element belonging to the manifold and being in phase-inversion with $\Psi_i$. The index of this element will be designated with $\tilde{i}$ in the following. Around $\tilde{\Psi}_i = \Psi_i \pm \pi$, f is close to its maximum. Expressed in formulae, the following applies:

$$f(\tilde{\Psi}_i = \Psi_i \pm \pi) = \frac{1-\cos(\pm \pi)}{2} = 1. \quad \text{(Equation 9)}$$

By equation 9 (or by the finding described in the equation 9), the resolution of the analog-digital converter may be relaxed or reduced significantly by introducing a sensing algorithm searching for a maximum of f and executing a response in phase inversion. The 180° shift may conveniently be subtracted by a digital combinatory circuit.

The last statement leads to a further important conclusion:

The architecture illustrated allows for the use of a sensing mechanism not based on an analog-digital converter (ADC). Since the maximum of f occurs at $K\pi$, for example, a precise and/or offset-free comparator is sufficient for the decision-making process.

Figure 15:
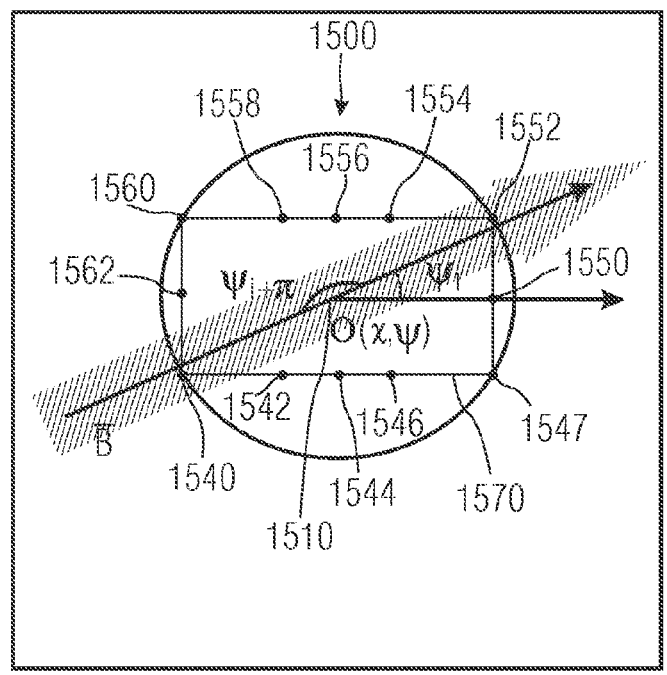
FIG. 15 is a schematic illustration of a phase inversion concept.

The above-described concept is depicted for illustration in FIG. 15. Thus, FIG. 15 shows a graphical illustration of a phase inversion concept. The graphical illustration according to FIG. 15 is designated with 1500 in its entirety. According to FIG. 15, an origin or center 1510 is defined, which also is designated with O (x, $\Psi$). Around the origin, along the sides of a rectangle 1570 or at the corners of the rectangle 1570, magnetoresistive sensor elements (e.g., GMR sensor elements) 1540-1562 are arranged. The main sensitivity directions of the magnetoresistive sensor elements 1540-1562 vary and, for example, are all oriented away from the origin 1510 (at least approximately) or oriented toward the origin 1510. An angle between the main sensitivity direction of the magnetoresistive sensor element 1562 and the magnetic field direction $\overline{B}$ is zero, for example. For example, according to equation 5, the following applies for the magnetoresistive sensor element 1552: $\Delta R/R(1552)=0$. The magnetoresistive sensor element 1552 thus takes on a nominal resistance, and the function f for the magnetoresistive sensor element 1552 equals 0. In contrast hereto, the magnetoresistive sensor element 1540 is in "phase inversion" with the magnetoresistive sensor element 1552, since the main sensitivity direction of the magnetoresistive sensor element 1540 for example is opposite to the main sensitivity direction of the magnetoresistive sensor element 1552. Thus, an angle between the main sensitivity direction of the magnetoresistive sensor element 1540 and the direction of the magnetic field $\overline{B}$, for example, is 180° or $\pi$. For the magnetoresistive sensor element 1540, the following applies: $\Delta R/R(1540)=1$. In other words, the function value f takes on a minimum value for the magnetoresistive sensor element 1552 and further takes on a maximum value for the magnetoresistive sensor element 1540. Thus, if it is detected at which magnetoresistive sensor element 1540-1562 there is maximum value of $\Delta R/R$ or of f, it is known that the identified magnetoresistive sensor element has a main sensitivity direction, for example, opposite to the direction of the magnetic field $\overline{B}$. Thus, if a direction opposite to the main sensitivity direction of the identified magnetoresistive sensor element (with f=1) is determined, this determined direction corresponds to the direction of the magnetic field $\overline{B}$.

In the following, it will be described on the basis of FIG. 16, how the evaluation of the signals provided from the magnetoresistive sensor elements 1540-1562 may take place. In this respect, for example, it is assumed that each of the magnetoresistive sensor elements 1540-1562 provide a signal, which, for example, describes an absolute or relative resistance change. The signal may for example be a voltage signal or a current signal. In the embodiment, the signal provided from the GMR sensor elements, for example, describes a value as defined by the function f.

Figure 16:
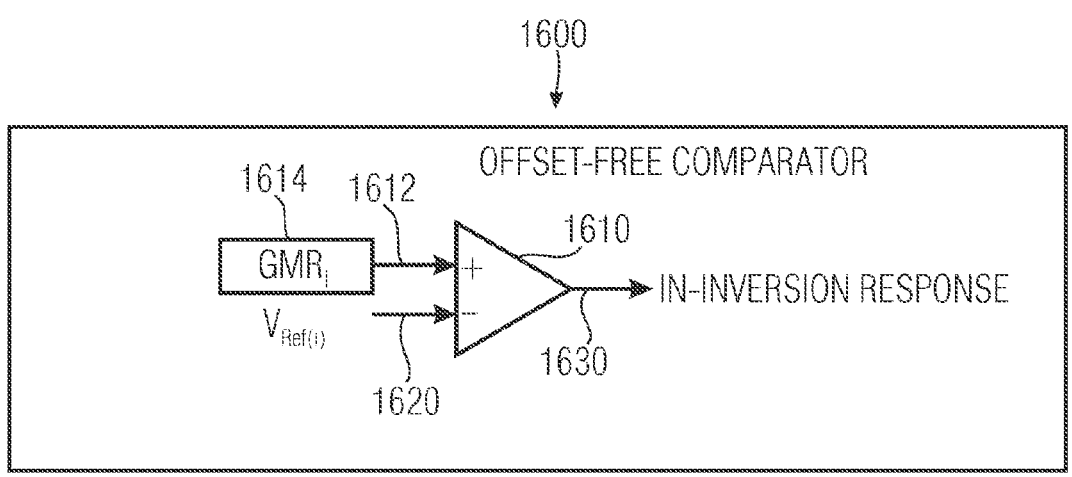
FIG. 16 is a schematic illustration of a basic idea of a sensing mechanism.

FIG. 16 shows a block circuit diagram of a circuitry for evaluation of the signals provided from the GMR sensor elements 1540 to 1562. The circuitry according to FIG. 16 is designated with 1600 in its entirety. The circuitry 1600 includes a comparator 1610, which may, for example, be a precise and/or offset-free comparator. A first (non-inverting) input 1612 of the comparator 1610 for example receives an output signal from an i-th magnetoresistive sensor element designated with 1614 or $GMR_i$ in FIG. 16. A second (inverting) input of the comparator 1610 for example receives an i-th reference signal 1620, which also is designated with $V_{REF(i)}$. The comparator 1610 is designed to provide, based on a comparison between the signals 1610 and 1620, an output signal 1630 describing a result of the comparison. The output signal 1630 of the comparator 1610 may be regarded as "in-inversion response".

For example, if the reference signal 1620 describes a value closely below a maximum signal value of the signal 1612, the circuitry 1600 allows for detection as to whether one of the magnetoresistive sensor elements 1540-1562 provides an at least approximately maximum signal. If the output signals of several magnetoresistive sensor elements 1540-1562 are evaluated by respective associated comparators 1610, it may altogether be determined which of the magnetoresistive sensor element provides a maximum signal. Based on the fact as to which of the magnetoresistive sensor elements provides a maximum signal, an angle may then be output, wherein the output angle depends on the main sensitivity direction of the identified magnetoresistive sensor element (for example, if identical with the main sensitivity direction or opposite to the main sensitivity direction).

In summary, it is to be stated that, on the basis of FIG. 16, a basic idea of a possible sensing mechanism according to an embodiment was described.

In addition, a calibration algorithm may be used in a production phase to store an exact GMR response for all elements (or magnetoresistive sensor elements) (for example, in a memory). A table containing the stored value may hence be used to obtain an adaptive reference voltage for the sensing mechanism according to FIG. 16.

In other words, the reference voltage 1620 for the comparator 1610 may, for example, be adjusted based on a value stored in a table.

Besides, it is to be pointed out that a comparator 1610 may for example be used for the evaluation of sensor signals from several magnetoresistive sensors. For example, a comparison between output signals from various magnetoresistive sensor elements 1540-1562 may take place, for example, sequentially. Besides, it is to be pointed out that, in a further embodiment, the same comparison signal may be used for the signals from all magnetoresistive sensor elements.

In the following, an analysis of a misalignment of the magnetization or of an alignment error of the magnetization will be described. In this respect, it is to be pointed out that the above-described solution is valid as long as the original magnetization is done in an ideal manner with a magnetic field perfectly centered in the origin of the manifold. In the following, an analysis of effects of a misalignment or an alignment error will be described.

At first, effects on a circumference or a (surrounding) circle will be described here.

Figure 17:
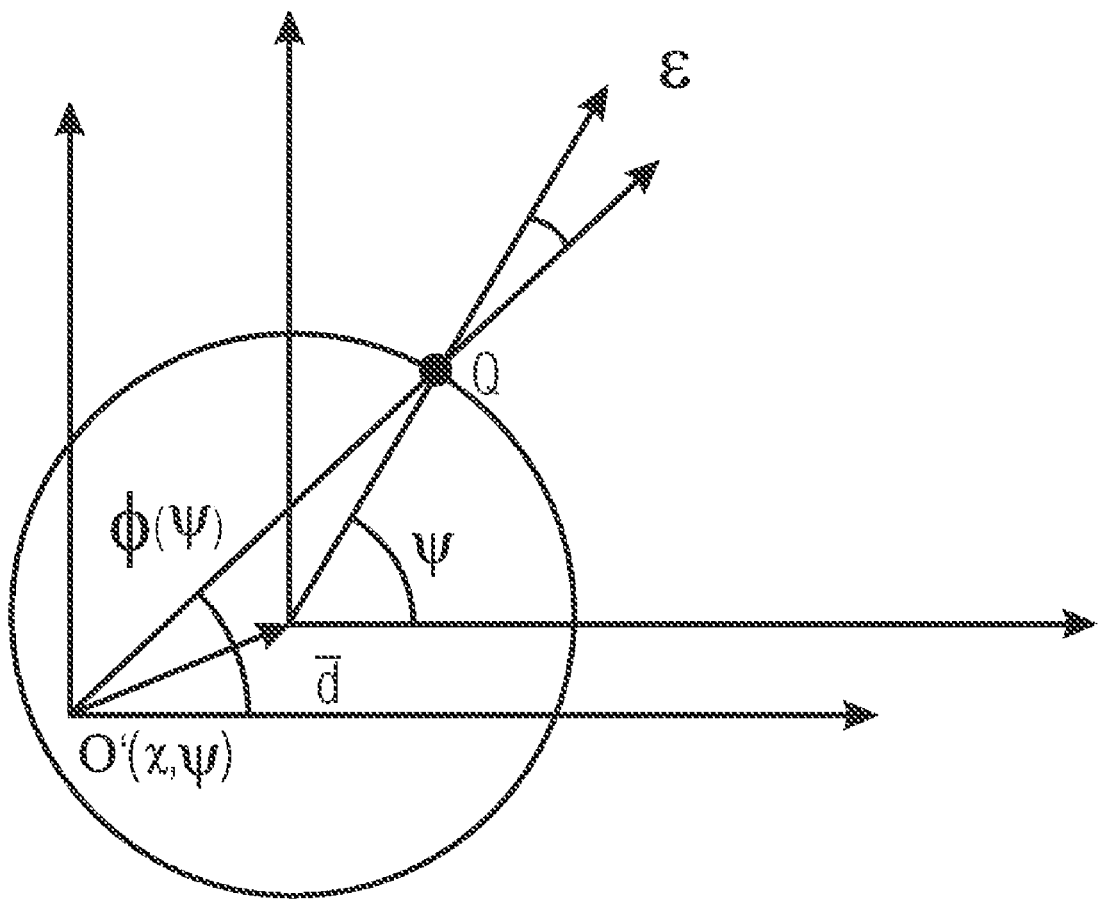
FIG. 17 is a schematic illustration of geometric parameters for describing an effect of a misalignment.

For an analysis of the misalignment or of the alignment error, a shift $\vec{d}$ of C relative to the origin of the applied magnetization field will be taken into account or taken into consideration in the following. FIG. 17 shows a graphical illustration of effects of a misalignment or an alignment error on the circumference or (surrounding) circle C. FIG. 17 very clearly shows an error produced for a given shift $\vec{d}$ at the point Q. According to a simple trigonometric consideration, it may be written:

$$\begin{cases} m_x = d_x + R\cos(\Psi) \\ m_y = d_y R \sin(\Psi) \\ \phi(\Psi) = \mathrm{atan}\left(\frac{m_y}{m_x}\right). \end{cases} \quad \text{(Equation 10)}$$

Finally, one obtains:

$$\epsilon(\psi) = |\phi(\psi) - \psi| \quad \text{(Equation 11)}$$

The error function $$\epsilon(\psi) = |\phi(\psi) - \psi|$$

is a function of four parameters $\Psi$, $d_x$, $d_y$, R, and hence is very complex with regard to its representation. In the following, the following values or value ranges will be assumed for the parameters:

R=2 mm;

$d_x$=[−200 ... 200] μm; and $d_y$=[−200 ... 200] μm.

Figure 18A:
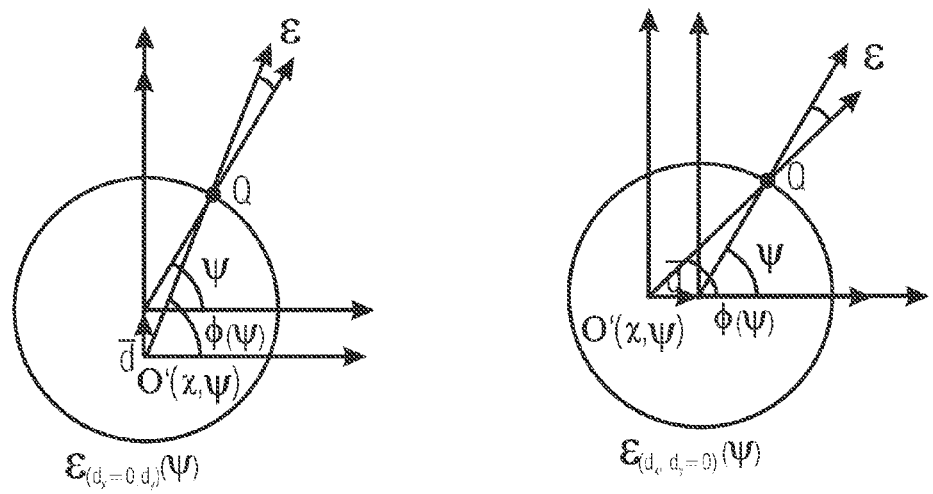
FIG. 18A is a graphical illustration of a misalignment-induced error for a first case of a misalignment.
Figure 18B:
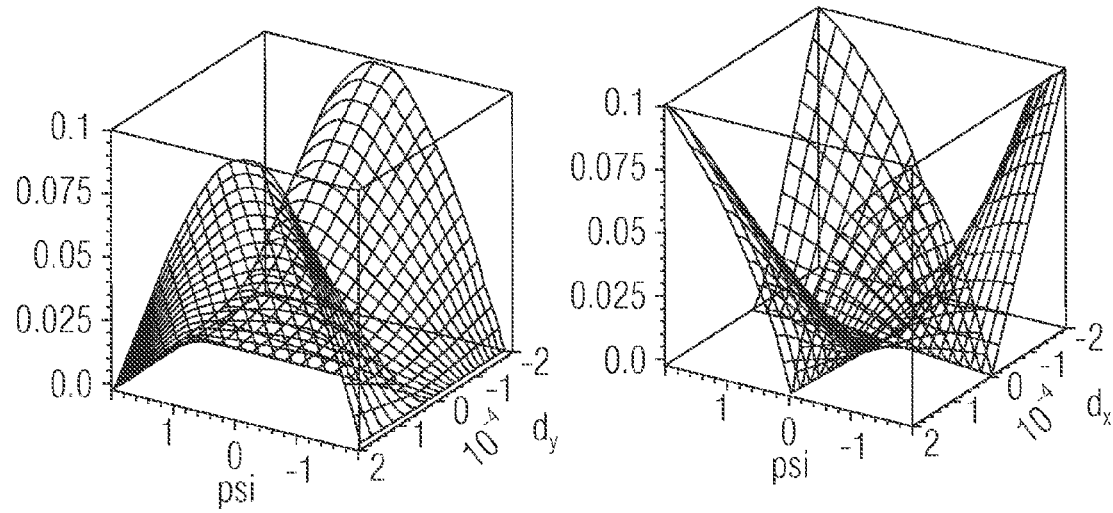
FIG. 18B is a graphical illustration of a misalignment-induced error for a second case of a misalignment.

FIGS. 18A and 18B, collective FIG. 18, shows a graphical illustration of an error caused by a misalignment or by an alignment error. In other words, FIG. 18 shows the error $\epsilon(\Psi)$ under the restrictions mentioned or the error $\epsilon(\Psi)$ restricted in this way. From the graphical illustrations of FIG. 18, it can clearly be seen that a ¼-symmetry approach may be used to determine or calculate the maximum error $\epsilon_{MAX}$. In a first case, that is if $d_y$=0 and $d_x$ varies, a maximum $\epsilon_{max,d_y}$ occurs at $\Psi$=0, and correspondingly:

$$\varepsilon_{\max,d_y} = \max\{\varepsilon_{(d_x=0,d_y)}(\Psi)\} = \mathrm{atan}\left(\frac{d_y}{R}\right). \quad \text{(Equation 12)}$$

In a second case, a maximum $\epsilon_{max,d_x}$ appears at $\Psi$=+−$\Psi$/2 in analog manner. The value of the maximum mentioned is as follows:

$$\varepsilon_{\max,d_x} = \max\{\varepsilon_{(d_x,d_y=0)}(\Psi)\} = \mathrm{atan}\left(\frac{R}{d_x}\right) - \frac{\pi}{2}. \quad \text{(Equation 13)}$$

Finally, the following applies:

$$\epsilon_{max} = \max\{\epsilon_{max,d_x}, \epsilon_{max,d_y}\} \quad \text{(Equation 14)}$$

Thus, it can be deduced that, for given tolerances $d_x$ and $d_y$, a maximum error due to misalignment of the magnetization field is given by the equation 14. Furthermore, the error concerned may be reduced by increasing R.

In the following, effects or impacts on the manifold will be described. After already having clarified the error mechanism above, it will be analyzed how the mapping concept is involved in the following.

Figure 19:
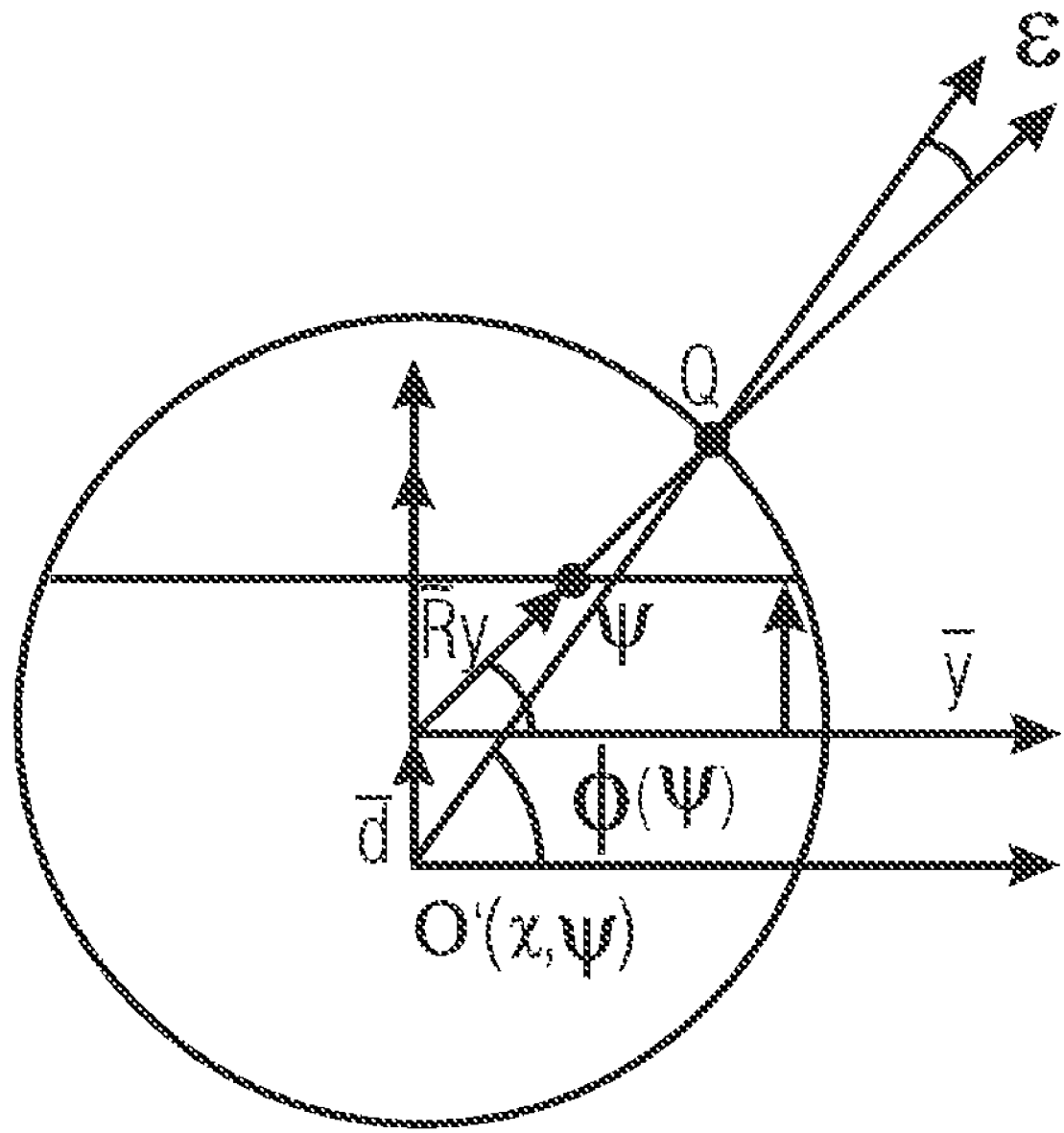
FIG. 19 is a schematic illustration of geometric parameters for describing an error through misalignment.

FIG. 19 shows a graphical illustration of an effect of misalignment on the manifold. FIG. 19 exemplarily shows an example along y.

On the basis of FIG. 19, it is not hard to see that the new geometry is easy to reference to the old one by taking into account two local equivalent circumferences or (surrounding) circles of beams. Thus, for example, the following applies:

$$\begin{cases} \tilde{R}_y = \dfrac{\overline{y}}{\sin(\Psi)} \\ \tilde{R}_x = \dfrac{\overline{x}}{\cos(\Psi)} \end{cases} \text{or} \quad \text{(Equation 15)}$$

As has been shown in the previous analysis, the maximum $\epsilon_{max,d_y}$ arises at $\psi$=0, wherein the value thereof can in this case be determined according to the following formula:

$$\varepsilon_{\max,d_y} = \max\{\varepsilon_{(d_x=0,d_y)}(\Psi)\} = \mathrm{atan}\left(\frac{d_y}{\overline{x}}\right). \quad \text{(Equation 16)}$$

In a second case, the maximum $\epsilon_{max,d_y}$ occurs at $\psi$=+−$\pi$/2 in analog manner, and its value is:

$$\varepsilon_{\max,d_x} = \max\{\varepsilon_{(d_x,d_y=0)}(\Psi)\} = \mathrm{atan}\left(\frac{\overline{y}}{d_x}\right) - \frac{\pi}{2}. \quad \text{(Equation 17)}$$

Finally, the following applies:

$$\epsilon_{max} = \max\{\epsilon_{max,d_x}, \epsilon_{max,d_y}\} \quad \text{(Equation 18)}$$

In summary, it may thus be stated that, as expected, the influences of the shift on the manifold are stronger than the influence on the theoretical circular pattern. If $\overline{x}$=$\overline{y}$=R*sqrt(2)/2 (i.e. if the magnetoresistive sensor elements are arranged along the sides (or at the corners) of a perfect square), the errors due to the mapping are almost 30% greater than in the original case. However, it is not necessary that $\overline{x}$ and $\overline{y}$ are equal. For example, once the actual mechanical tolerances of the magnetization equipment are known, both $\overline{x}$ and $\overline{y}$ may be optimized to reduce errors induced by misalignment. In this case it is recommendable to pay particular attention to the implementation of the inversion algorithm embodiment. With different $\overline{x}$ and $\overline{y}$, it is not necessarily guaranteed, after all, that an element or sensor element phase-shifted (or rotated) by 180° with respect to a sensor element does exist.

In the following, on the basis of FIG. 20, an exemplary algorithm will be described, which may be used to evaluate signals from a sensor arrangement, as, for example, described on the basis of FIGS. 4 and 15. For example, it is assumed that N+2 sensor elements exist, which are indicated with indices idx. Furthermore, it is assumed that each of the N+2 sensor elements provides an output signal, which is amplified correspondingly to an amplification. The amplification may for example take place digitally or in analog manner.

Figure 20:
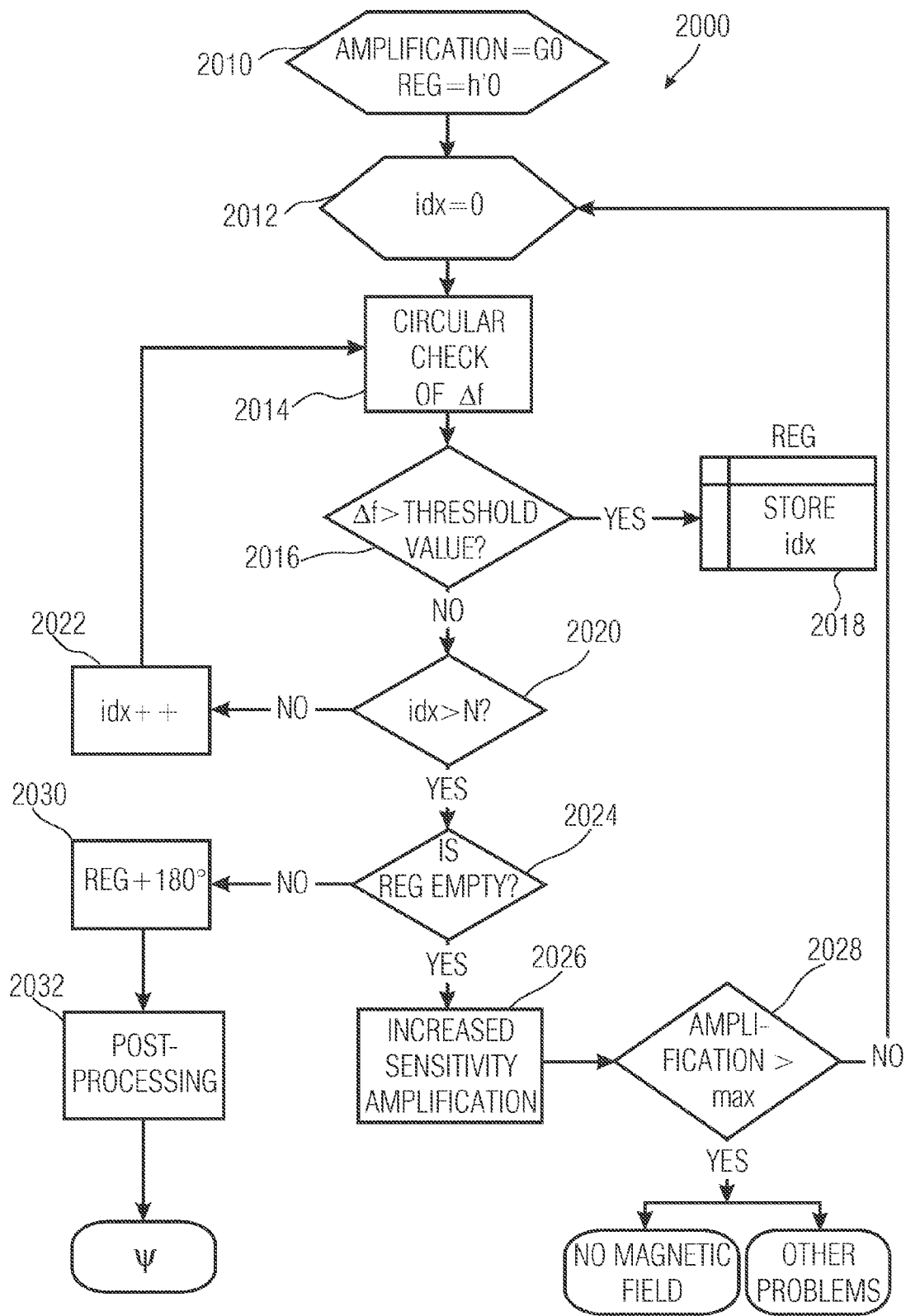
FIG. 20 is a flow chart of a method for determining an angle value, according to an embodiment.

The method according to FIG. 20 is designated with 2000 in its entirety. The method 2000 includes, in a first step 2010, adjusting the amplification mentioned to an initial value $G_0$. Furthermore, the method 2000 includes, in the step 2010, pre-adjusting a register REG, which may, for example, store a list of several values, to an empty list state. Adjusting takes place according to the rule REG=h'0. In a second step 2012, the value of the index idx is adjusted to 0, whereby a first sensor element is designated. Then, in a third step 2014, a circular check of $\Delta f$ is done. In a fourth step 2016, it is checked whether $\Delta f$ is greater than a given threshold value. If this is the case, an index idx belonging to the sensor element just considered is stored in the register REG. But if $\Delta f$ is not greater than the threshold value (or is smaller than the threshold value), the method 2000 is continued in a sixth step 2020. The sixth step 2020 by the way also takes place following the storage in the fifth step 2018. In the sixth step 2020, it is checked whether the index idx is greater than N. If this is not the case, in a seventh step 2022, the index idx is incremented (indicated by the operation idx ++), and the method is continued with a repeated circular check in the third step 2014. But if the index idx is greater than N and this is determined in the sixth step 2020, it is checked whether the register REG is empty, in an eighth step 2024. If this is the case, sensitivity of the sensor arrangement and/or amplification is increased in a ninth step 2026. In a tenth step 2028, it then is checked further whether the new sensitivity and/or the new amplification is greater than a default maximum allowable sensitivity or greater than a default maximum allowable amplification. If this is not the case, the method is continued in the second step 2012, and the procedures described (i.e., the evaluation of the sensor signals from the individual sensor elements) are repeated with increased sensitivity and/or increased amplification. But if it is determined, in the step 2028, that the amplification is greater than the maximum allowable amplification, or that the sensitivity is greater than the maximum allowable sensitivity, for example, an error treatment takes place. One possible error may consist in the fact that there is no magnetic field or that another problem has occurred. The error treatment may, for example, include the output of an error message.

Besides, if it is determined that the register REG is not empty in the eighth step 2024, an angle calculation takes place in an eleventh step 2030. For example, an angle corresponding to a magnetoresistive sensor element the index idx of which is stored in the register REG may be identified. In addition to the angle thus obtained, for example, also an opposite angle may be obtained by addition of 180° or by subtraction of 180°. Besides, in a twelfth step 2032, post-processing of the angle obtained in the eleventh step 2030 may take place, and the post-processing may, for example, include averaging. Besides, by the (optional) post-processing 2032 or directly by the eleventh step 2030, information on an angle $\psi$, describing under which angle an externally applied magnetic field acts on the sensor arrangement, may be obtained.

In the following, some details with respect to the method 2000 described on the basis of the flow chart of FIG. 20 will be described. The method 2000 according to FIG. 20 altogether forms a simple algorithm for realization of a sensing mechanism. Apart from a normal data flow, two additional activities are added. In the case of disturbances, the angle sought may, for example, be concerned by some uncertainty. Through a loop and a register, it is possible to store the calculated angle several times and later carry out digital averaging to reduce effects or influences of disturbances. Apart from this, there further exists a type of sensitivity compensation loop. This may, for example, prove useful in the case of very weak GMR sensitivity. Besides, it is to be pointed out that the method shown on the basis of FIG. 20 only represents a rough embodiment, which may be supplemented further to perform an additional signal conditioning prior to the signal processing and after the signal processing. In other words, for example, preprocessing signal conditioning or additional post-processing signal conditioning may be used.

Figure 21:
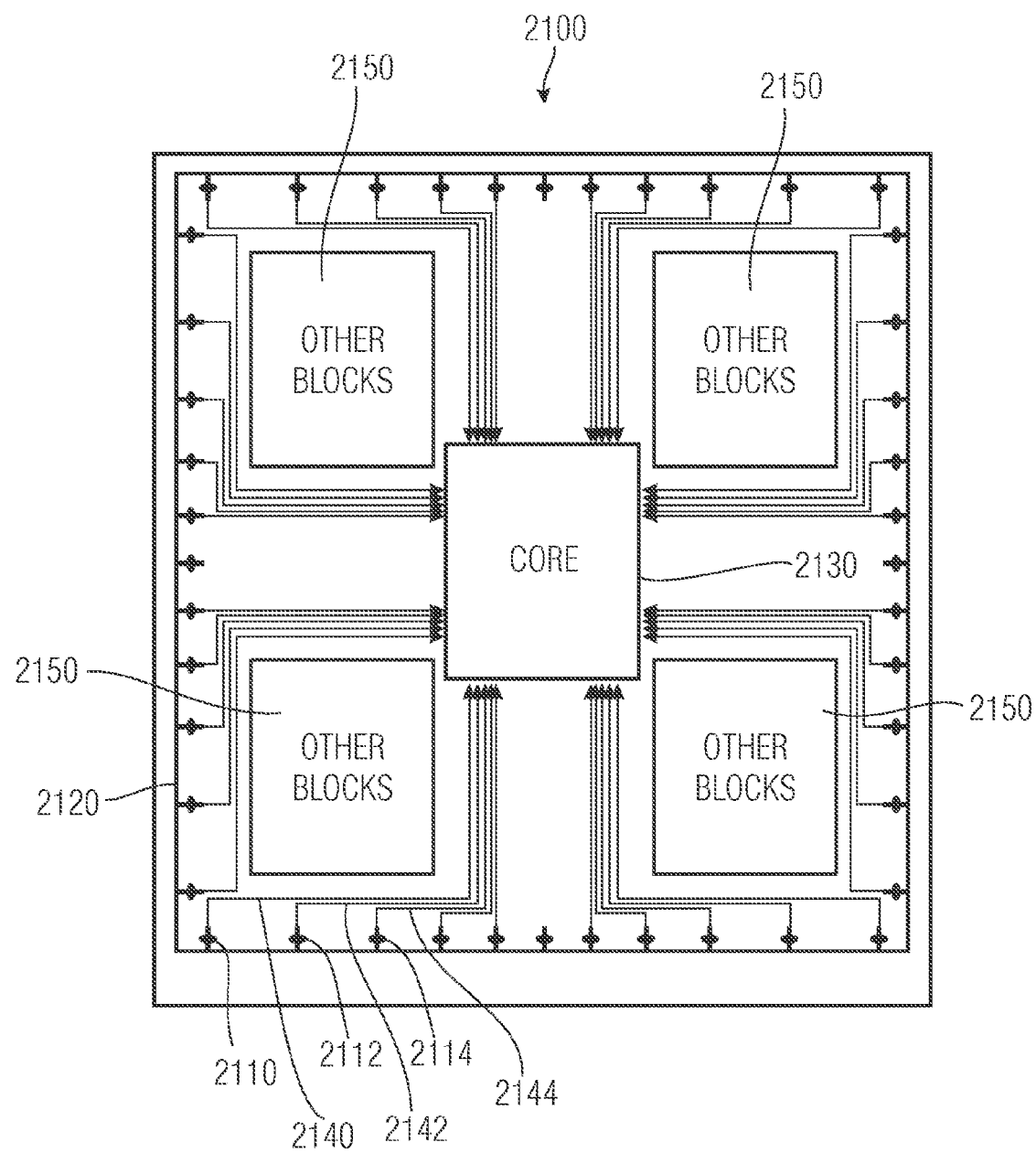
FIG. 21 is a schematic illustration of a possible spatial distribution in a sensor, according to an embodiment.

In the following, on the basis of FIG. 21, plan view considerations or layout considerations with respect to a sensor arrangement will be described. FIG. 21 here represents a proposal for a block arrangement in a sensor. The sensor according to FIG. 21 is designated with 2100 in its entirety. The sensor or the sensor arrangement 2100 according to FIG. 21 includes a plurality of magnetoresistive sensor elements 2110, 2112, 2114, which are arranged along the sides of a rectangle or square. The sensor arrangement further includes a ground connection 2120 for the magnetoresistive sensor elements 2110, 2112, 2114. The ground connection 2120 here, for example, encloses the entire sensor arrangement. The sensor arrangement 2100 further includes a core 2130. The magnetoresistive sensor elements are connected to the core 2130 via connection lines 2140, 2142, 2144. The sensor arrangement may further (optionally) include other blocks 2150, which, for example, are arranged between a center of the sensor arrangement (for example, defined as a center between the corners of the ground connection 2120) and the outer corners of the sensor arrangement (for example defined by the ground connection). Furthermore, the core 2130 may be arranged at a center of the sensor arrangement.

In summary, it may thus be stated that FIG. 21 shows an implementation of a plan view of the described concept according to an embodiment. As illustrated in FIG. 21, it is advisable to have the main core 2130 at the center or in the middle of an integrated circuit so as to balance the resistance-bearing or resistive paths to the GMR elements. Other blocks 2150 may find place at other locations. A perimetric or circling line 2120 further represents a ground connection of the GMR elements 2110, 2112, 2114.

In the following, some practical rules for main design parameters will be described. The rules mentioned are, however, to be understood as exemplary and not as limiting.

So as to provide a pragmatic approach for the determination of the design parameter $\overline{y}$, for example, the problem may be approached by assuming reasonable values for the angle resolution $\delta\Psi$ and $\Delta x_{min}$.

In the following, for the case $\overline{x}=\overline{y}$, a calculation scheme will be illustrated in analytical form. Then, some examples will be shown with numerical quantities. Limitations or boundary conditions thus will be fixed by the following statements:

technological limitations are reflected by $\Delta x_{min}/\overline{x}/2$;

a resolution step $\delta\Psi$ limits $\overline{y}$.

The second assumption may be interpreted clearly, although this is not obvious at first sight.

A first quadrant of the circumference C should contain $n=\pi/\delta\Psi$ mapping points, for example. Hence:

$$\overline{x}=\Sigma\Delta x_i \overline{y}$$

The assumption immediately becomes clear if equation 2 is also taken into account.

Hence, for example, the problem described by the following equation is to be solved analytically:

$$\frac{\Delta x_{min}}{2} = \overline{y} \cdot \tan\left(\frac{\delta\Psi}{2}\right). \quad \text{(Equation 19)}$$

For example, if an angle sensor is to be obtained, which is capable of resolving angle steps of $\delta\Psi=1°$ (as this is possible in some conventional angle sensors), the following is obtained, using $\Delta x_{min}=10$ μm as minimum distance between sensor elements or sensitive elements:

$$\begin{cases} \Delta x_{min} = 10 \text{ μm} \\ \delta\Psi = 0.1° \end{cases} \Rightarrow \overline{y} \approx 0.57 \text{ mm.} \quad \text{(Equation 20)}$$

Thus, it may be deduced that a total area of $(2\overline{y})^2 \sim 1.3 \text{ mm}^2$ of is sufficient for the construction of a pattern scheme for a resolution of 1°.

With respect to industrial mass production, these results are very attractive. As compared with conventional solutions, the solution described here allows for huge savings in area, for example.

Embodiments of the architecture described, for example, offer the following advantages here, depending on the concrete realization:

simple algorithm: no microprocessor needed;
threshold-value-based decision: no analog-digital converter (ADC) needed;
very quick response;
simple solid coil for the step of GMR magnetization;
simple one-step magnetization: all elements can be magnetized at once, even on wafer level; smaller mechanical tolerances result; no laser is needed;
fixed accuracy and angle repeatability (due to the geometrical GMR pattern);
no GMR shape anisotropy: an octahedral or eight-faced unit element is sufficient for the purpose;
insensitivity with respect to rotation and a z axis: only a phase shift (or angle shift) is produced; and
very small area as compared with traditional architectures (atan architectures).

Furthermore, it is possible to perform an adaptation of the sensitivities of GMR sensor elements. This may, for example, be done by trimming or adapting or by the application of a calibration algorithm.

In one embodiment, also an adaptation of GMR sensitivity may be performed. This may be done by trimming or by calibration algorithms.

In summary, it may be stated that conventional magnetoresistive sensors, independently of the purpose for which they are designed (e.g., velocity, angle, direction), consist of a sensitive magnet element, which is arranged in a four-branch bridge. Furthermore, conventionally a core with a digital signal processor (DSP) is needed to perform all the signal processing activities needed. Functions like compensation of a misadjustment, reduction of hysteresis and similar functions belong to this block. One of the main problems in magnetoresistive angle sensors is the computation power needed to calculate the angle from the signals in phase quadrature.

Some of the above-described embodiments show a new arrangement-based or layout-based architecture for implementation of an angle sensor. The angle sensor consists of GMR elements arranged or laid out so as to map an angle of 360° to a Cartesian manifold. The angle determination mechanism or angle sensing mechanism was already explained in detail on the basis of the above description of a suitable algorithm.

In other words, some embodiments of the present invention relate to a pattern-based architecture for GMR angle sensors and to a radial GMR write-in arrangement for angle measuring bridges.

Other embodiments define a magnetic field sensor including a bridge arrangement.

Some embodiments solve the problem of achieving acceleration of a magnetic GMR write-in process and concurrent improvement of sensor errors showing as a trapezoidal distortion of the component signals (harmonic wave).

Besides, some of the embodiments may be employed with all magnetoresistive angle sensors or all types of magnetoresistive sensor elements.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A sensor for sensing a magnetic field direction, comprising:
   a plurality of magnetoresistive sensor elements, each sensor element comprising a main sensitivity direction with respect to a present magnetic field,
   wherein lines associated with the main sensitivity directions of the magnetoresistive sensor elements and passing through the magnetoresistive sensor element intersect in an area outside the magnetoresistive sensor elements themselves.

2. The sensor according to claim 1, wherein the lines intersect in a central area around which the magnetoresistive sensor elements are arranged.

3. The sensor according to claim 2, wherein the central area is a convex area.

4. The sensor according to claim 1, wherein the main sensitivity directions of the magnetoresistive sensor elements are oriented toward the area in which the lines intersect.

5. The sensor according to claim 4, wherein the magnetoresistive sensor elements are arranged so that half-lines originating from the magnetoresistive sensor elements and passing in the main sensitivity directions of the respective magnetoresistive sensor elements converge in the area in which the lines intersect.

6. The sensor according to claim 1, wherein the main sensitivity directions of the magnetoresistive sensor elements are oriented away from the area in which the lines intersect.

7. The sensor according to claim 6, wherein the magnetoresistive sensor elements are arranged so that half-lines originating from the magnetoresistive sensor elements and passing opposite to the main sensitivity directions of the respective magnetoresistive sensor elements converge in the area in which the lines intersect.

8. The sensor according to claim 1, wherein the area in which the lines intersect comprises a maximum dimension of no more than 10% of a maximum distance between two magnetoresistive sensor elements belonging to the sensor.

9. The sensor according to claim 1, wherein the area in which the lines intersect comprises a maximum dimension of no more than 1% of a maximum distance between two magnetoresistive sensor elements belonging to the sensor.

10. The sensor according to claim 1, wherein the lines intersect approximately in a point.

11. The sensor according to claim 1, wherein the sensor comprises at least four magnetoresistive sensor elements, wherein lines associated with the main sensitivity directions of the at least four magnetoresistive sensor elements and passing through the magnetoresistive sensor elements intersect in an area outside the magnetoresistive sensor elements themselves.

12. The sensor according to claim 11, wherein the magnetoresistive sensor elements are arranged so that the magnetoresistive sensor elements are substantially point-symmetrical to the area in which the lines intersect.

13. The sensor according to claim 11, wherein the four magnetoresistive sensor elements are arranged at corner points of a rectangle, apart from an admissible location tolerance, wherein the location tolerance is defined so that a distance of a magnetoresistive sensor element from a corresponding corner point is no more than 10% of a side length of the rectangle, and
wherein the main sensitivity directions of the four magnetoresistive sensor elements are all oriented toward a center of the rectangle or away from a center of the rectangle.

14. The sensor according to claim 13, wherein the four magnetoresistive sensor elements are coupled into a bridge circuit.

15. The sensor according to claim 11, wherein the sensor comprises at least eight magnetoresistive sensor elements, wherein lines associated with the main sensitivity directions of the at least eight magnetoresistive sensor elements and passing through the magnetoresistive sensor elements intersect in an area outside the magnetoresistive sensor elements themselves.

16. The sensor according to claim 15, wherein four magnetoresistive sensor elements forming a first set of magnetoresistive sensor elements are arranged at corner points of a first rectangle, apart from an admissible location tolerance,
wherein the location tolerance is defined so that a distance of a magnetoresistive sensor element from a corresponding corner point is no more than 10% of a side length of the rectangle, and
wherein four further magnetoresistive sensor elements forming a second set of magnetoresistive sensor elements are arranged at corner points of a second rectangle, apart from an admissible location tolerance, wherein the second rectangle results from the first rectangle by rotation about an angle ranging from about 70° to about 110°, and wherein the first rectangle and the second rectangle form a cross.

17. The sensor according to claim 16, wherein the four magnetoresistive sensor elements of the first set of magnetoresistive sensor elements are connected into a first bridge circuit, and wherein the four magnetoresistive sensor elements of the second set of magnetoresistive sensor elements are connected into a second bridge circuit.

18. The sensor according to claim 1, wherein the magnetoresistive sensor elements are arranged in a circular ring around the area in which the lines intersect.

19. The sensor according to claim 1, wherein the magnetoresistive sensor elements are arranged along sides of a rectangle.

20. The sensor according to claim 19, wherein at least two magnetoresistive sensor elements are arranged along each side of the rectangle.

21. The sensor according to claim 19, wherein main sensitivity directions of magnetoresistive sensor elements arranged along a side of the rectangle differ by no more than about 45°.

22. The sensor according to claim 21, wherein main sensitivity directions of adjacent magnetoresistive sensor elements arranged along a side of the rectangle enclose an angle between about 22° and about 45°.

23. The sensor according to claim 21, wherein main sensitivity directions of adjacent magnetoresistive sensor elements arranged along a side of the rectangle enclose an angle of no more than about 10°.

24. The sensor according to claim 1, wherein the magnetoresistive sensor elements are arranged along an arrangement line.

25. The sensor according to claim 24, wherein the magnetoresistive sensor elements arranged in a central area of the arrangement line comprise a smaller distance than the magnetoresistive sensor elements arranged in an outer area of the arrangement line.

26. The sensor according to claim 24, wherein angles of the main sensitivity directions of the magnetoresistive sensor elements arranged along the arrangement line form a monotonic sequence along the arrangement line.

27. The sensor according to claim 24, wherein angles of the main sensitivity directions of the magnetoresistive sensor elements arranged along the arrangement line vary in a substantially linear manner along the arrangement line.

28. The sensor according to claim 1, wherein at least four magnetoresistive sensor elements being part of a sensor for determining a single angle value are arranged along an arrangement line.

29. The sensor according to claim 1, wherein at least twelve magnetoresistive sensor elements are arranged along four sides of a rectangle, so that at least three magnetoresistive sensor elements are arranged along each of the sides of the rectangle, and wherein the magnetoresistive sensor elements are substantially point-symmetrical to a center of the rectangle.

30. The sensor according to claim 1, wherein the main sensitivity directions of the magnetoresistive sensor elements are set by applying a substantially radially symmetrical magnetic field common to all the magnetoresistive sensor elements and by heating initial structures of the magnetoresistive sensor elements, wherein an axis of the radially symmetrical magnetic field passes through the area in which the lines intersect.

31. A magnetic field direction sensor for sensing a magnetic field direction, comprising:
a plurality of magnetoresistive sensor elements, each sensor element comprising a main sensitivity direction with respect to a present magnetic field, wherein lines associated with the main sensitivity directions of the magnetoresistive sensor elements and passing through the magnetoresistive sensor elements intersect in an area outside the magnetoresistive sensor elements themselves; and
an arrangement for determining information related to the magnetic field direction based on information as to at which of the magnetoresistive sensor elements a maximum change in resistance, induced by an applied magnetic field, is present with respect to the other magnetoresistive sensor elements, or based on information as to at which of the magnetoresistive sensor elements a minimum change in resistance, induced by an applied magnetic field, is present with respect to the other magnetoresistive sensor elements.

32. The magnetic field direction sensor according to claim 31, wherein the arrangement for determining information on the magnetic field direction comprises a comparator for determining whether a change in resistance of a magnetoresistive sensor element with respect to a state without applied external magnetic field is greater than a default maximum value or smaller than a default minimum value.

33. The magnetic field direction sensor according to claim 32, wherein the arrangement for determining information on the magnetic field direction comprises a reference value memory for storing the minimum value or the maximum value.

34. The magnetic field direction sensor according to claim 31, wherein the arrangement for determining information on the magnetic field direction comprises an angle calculator for calculating an estimate for the magnetic field direction based on encoded information as to at which of the magnetoresistive sensor elements a maximum magnetic-field-induced change in the resistance or a minimum magnetic-field-induced change in the resistance is present.

35. The magnetic field direction sensor according to claim 31, wherein the arrangement for determining information on the magnetic field direction comprises an amplifier for amplifying signals from the magnetoresistive sensor elements with adjustable amplification, to acquire amplified signals;
   a determiner for determining whether one of the amplified signals reaches or exceeds a threshold value;
   an incrementer for increasing the amplification step-by-step, until at least one of the amplified signals reaches or exceeds the threshold value; and
   a determiner for determining an estimate for the magnetic field direction, depending on which of the magnetoresistive sensor elements an amplified signal reaching or exceeding the threshold value was generated.

36. A method for producing magnetic field sensors, comprising:
   providing a carrier a plurality of permanently magnetizable magnetic field sensor structures arranged thereon, wherein the permanently magnetizable magnetic field sensor structures comprise a magnetization minimum temperature;
   generating a magnetic field in which magnetic field lines pass outwardly in various directions, starting from a magnetic field center, or in which magnetic field lines pass from the outside to the magnetic field center in various directions, so that various ones of the magnetic field sensor structures are penetrated by the magnetic field in various directions; and
   heating the magnetic field sensor structures to set a permanent magnetization of the magnetic field sensor structures, so that, after heating, there are a plurality of magnetoresistive sensor elements, each of which comprising a main sensitivity direction with respect to an applied magnetic field, wherein lines associated with the main sensitivity directions of the magnetoresistive sensor elements and passing through the magnetoresistive sensor elements intersect in an area corresponding to or adjacent to the magnetic field center.

37. The method according to claim 36, wherein the magnetic field generated is substantially radially symmetrical, and wherein the magnetic field is generated so that radial magnetic field components of the radially symmetrical magnetic field pass in different directions at the locations of the magnetic field sensor structures.

38. The method according to claim 36, wherein permanent magnetizations are set in at least two magnetoresistive sensor elements by the magnetic field in one magnetization step, wherein the directions of the permanent magnetizations set in one working step enclose an angle of at least 22°.

39. The method according to claim 36, wherein permanent magnetizations are set in at least four magnetoresistive sensor elements by applying a single magnetic field, so that directions of the permanent magnetizations are all oriented toward the magnetic field center.

40. The method according to claim 39, wherein directions of the permanent magnetizations are oriented toward the magnetic field center in a star-shaped manner.

41. The method according to claim 36, wherein permanent magnetizations are set in at least four magnetoresistive sensor elements by applying a single magnetic field, so that directions of the permanent magnetizations are all oriented away from the magnetic field center.

42. The method according to claim 36, wherein the magnetic field center is formed by a central pole of a magnet.

43. The method according to claim 42, wherein the central pole of the magnet comprises a rectangular cross-section, and wherein an associated outer pole lies opposite to each edge of the central pole in a cross-section, and
   wherein the magnet is positioned such that a first magnetic field sensor structure is penetrated by magnetic field lines passing between the central pole and a first outer pole,
   such that a second magnetic field sensor structure is penetrated by magnetic field lines passing between the central pole and a second outer pole,
   such that a third magnetic field sensor structure is penetrated by magnetic field lines passing between the central pole and a third outer pole, and
   such that a fourth magnetic field sensor structure is penetrated by magnetic field lines passing between the central pole and a fourth outer pole.

44. The method according to claim 42, wherein the central pole of the magnet comprises a round cross-section, and wherein the central pole of the magnet is surrounded by an outer pole with a circular internal cross-section, and
   wherein the magnet is positioned such that a first magnetic field sensor structure is penetrated by field lines passing in a first radial direction between the central pole and the outer pole in a cross-section,
   such that a second magnetic field sensor structure is penetrated by field lines passing in a second radial direction between the central pole and the outer pole in a cross-section,
   such that a third magnetic field sensor structure is penetrated by magnetic field lines passing in a third radial direction between the central pole and the outer pole in a cross-section, and
   such that a fourth magnetic field sensor structure is penetrated by field lines passing in a fourth radial direction between the central pole and the outer pole in a cross-section, wherein the four radial directions are different from each other.

45. The method according to claim 44, wherein the four radial directions cover an angle range of at least 45°.

46. A write-in apparatus for producing magnetic field sensors, the apparatus comprising:
- a magnet formed to generate a magnetic field in which magnetic field lines pass outwardly in various directions, starting from a magnetic field center, or in which magnetic field lines pass from the outside in various directions toward a magnetic field center;
- a positioner formed to position the magnet with respect to a carrier carrying a plurality of magnetic field sensor structures so that various ones of the magnetic field sensor structures are penetrated in various directions by magnetic field lines originating from the magnetic field center or passing toward the magnetic field center; and
- an energy source formed so as to supply the magnetic field sensor structures with energy, to enable permanent magnetizations to be set in the magnetic field sensor structures by the magnetic field generated by the magnet.

47. The write-in apparatus according to claim 46, wherein the magnet comprises a central pole with a rectangular cross-section, and wherein an associated outer pole lies opposite to each edge of the central pole in a cross-section.

48. The write-in apparatus according to claim 47, wherein the positioner is formed to position the magnet with respect to the carrier so that a first magnetic field sensor structure is penetrated by magnetic field lines passing between the central pole and a first outer pole;
- that a second magnetic field sensor structure is penetrated by magnetic field lines passing between the central pole and a second outer pole;
- that a third magnetic field sensor structure is penetrated by magnetic field lines passing between the central pole and a third outer pole; and
- that a fourth magnetic field sensor structure is penetrated by magnetic field lines passing between the central pole and a fourth outer pole.

49. The write-in apparatus according to claim 46, wherein the magnet comprises a central pole with a round cross-section, and wherein the central pole is surrounded by an outer pole with a circular internal cross-section.

50. The write-in apparatus according to claim 49, wherein the positioner is formed to position the magnet with respect to the carrier so that a first magnetic field sensor structure is penetrated by field lines passing in a first radial direction between the central pole and the outer pole in a cross-section;
- that a second magnetic field sensor structure is penetrated by field lines passing in a second radial direction between the central pole and the outer pole in a cross-section;
- that a third magnetic field sensor structure is penetrated by field lines passing in a third radial direction between the central pole and the outer pole in a cross-section; and
- that a fourth magnetic field sensor structure is penetrated by field lines passing in a fourth radial direction between the central pole and the outer pole in a cross-section, wherein the four radial directions are different from each other.

51. A sensor for sensing a magnetic field direction of an applied magnetic field, comprising:
- a plurality of magnetoresistive sensor elements arranged along edges of a rectangle, wherein positions of the magnetoresistive sensor elements along the edges of the rectangle are defined by intersections of a plurality of radial beams originating from a center in a plurality of uniformly distributed directions with the rectangle,
- wherein each magnetoresistive sensor element comprises a main sensitivity direction with respect to a present magnetic field, and
- wherein main sensitivity directions of the magnetoresistive sensor elements are oriented away from the center or are oriented toward the center; and
- a magnetic field direction determiner formed to determine at which of the magnetoresistive sensor elements the applied magnetic field causes a maximum or minimum change in electrical resistance, and to provide a measurement value for the magnetic field direction based thereon.

52. A sensor for sensing a magnetic field direction of an applied magnetic field, comprising:
- a first full bridge comprising first, second, third and fourth magnetoresistive sensor elements; and
- a second full bridge comprising fifth, sixth, seventh and eighth magnetoresistive sensor elements,
- wherein the first magnetoresistive sensor element and the second magnetoresistive sensor element are arranged along a first side of a rectangle,
- wherein the third magnetoresistive sensor element and the fourth magnetoresistive sensor element are arranged along a second side of the rectangle opposite the first side of the rectangle,
- wherein the fifth magnetoresistive sensor element and the sixth magnetoresistive sensor element are arranged along a third side of the rectangle,
- wherein the seventh magnetoresistive sensor element and the eighth magnetoresistive sensor element are arranged along a fourth side of the rectangle opposite the third side of the rectangle,
- wherein the first to eighth magnetoresistive sensor elements comprise respective main sensitivity directions with respect to an applied magnetic field, and
- wherein the main sensitivity directions of the first to eighth magnetoresistive sensor elements are all oriented away from an interior of the rectangle, or wherein the main sensitivity directions of the first to eighth magnetoresistive sensor elements are all oriented toward an interior of the rectangle.

* * * * *